United States Patent
Bang

(10) Patent No.: US 10,600,470 B2
(45) Date of Patent: Mar. 24, 2020

(54) MEMORY DEVICE AND MEMORY SYSTEM PERFORMING A HAMMER REFRESH OPERATION AND ASSOCIATED OPERATIONS

(71) Applicant: SAMSUNG ELECTRONICS CO., LTD., Suwon-si, Gyeonggi-Do (KR)

(72) Inventor: Jong-Min Bang, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 30 days.

(21) Appl. No.: 15/677,439

(22) Filed: Aug. 15, 2017

(65) Prior Publication Data

US 2018/0158507 A1    Jun. 7, 2018

(30) Foreign Application Priority Data

Dec. 6, 2016 (KR) .......................... 10-2016-0165419

(51) Int. Cl.
| | | |
|---|---|---|
| *G11C 7/00* | (2006.01) | |
| *G11C 11/406* | (2006.01) | |
| *G11C 16/34* | (2006.01) | |
| *G06F 12/02* | (2006.01) | |
| *G11C 11/408* | (2006.01) | |

(52) U.S. Cl.
CPC ... *G11C 11/40603* (2013.01); *G11C 11/40611* (2013.01); *G11C 16/3418* (2013.01); *G06F 12/0246* (2013.01); *G11C 11/408* (2013.01)

(58) Field of Classification Search
CPC ......... G11C 11/40603; G11C 11/40611; G11C 16/3418
USPC ............................... 365/222, 230.04, 185.18
See application file for complete search history.

(56) References Cited

U.S. PATENT DOCUMENTS

| | | | |
|---|---|---|---|
| 9,117,544 B2* | 8/2015 | Bains | ............... G11C 11/40615 |
| 9,202,549 B2 | 12/2015 | Lee et al. | |
| 9,299,400 B2 | 3/2016 | Bains et al. | |
| 9,384,821 B2 | 7/2016 | Bains et al. | |
| 2015/0243338 A1* | 8/2015 | Sohn | ..................... G11C 11/406 |
| | | | 365/189.05 |
| 2015/0262652 A1 | 9/2015 | Igarashi | |
| 2016/0103726 A1 | 4/2016 | Benedict et al. | |
| 2016/0180899 A1 | 6/2016 | Kilmer et al. | |
| 2016/0211008 A1 | 7/2016 | Benedict et al. | |
| 2016/0224262 A1 | 8/2016 | Mandava et al. | |
| 2016/0225433 A1 | 8/2016 | Bains et al. | |
| 2017/0186481 A1* | 6/2017 | Oh | .................... G11C 11/40615 |
| 2017/0213586 A1* | 7/2017 | Kang | ..................... G06F 3/0619 |
| 2017/0263305 A1* | 9/2017 | Cho | ....................... G11C 11/408 |

* cited by examiner

*Primary Examiner* — Connie C Yoha
(74) *Attorney, Agent, or Firm* — F. Chau & Associates, LLC

(57) ABSTRACT

A memory system includes a memory controller and a memory device. The memory controller determines and provides a hammer address. The hammer address is an address that has an activation number or frequency greater than a predetermined threshold. The memory device generates a hammer refresh signal representing a timing for a hammer refresh operation to refresh a first row of the memory device that is physically adjacent to a second row of the memory device corresponding to the hammer address. The memory device performs the hammer refresh operation using the hammer address provided from the memory controller and the hammer refresh signal generated by the memory device.

20 Claims, 24 Drawing Sheets

FIG. 9

| COMMAND | | CS | CA0 | CA1 | CA2 | CA3 | CA4 | CA5 | CA6 | CK EDGE |
|---|---|---|---|---|---|---|---|---|---|---|
| ACT | ACTa | H | H | L | L | BA0 | BA1 | BA2 | BA3 | RE1 |
| | | L | R12 | R13 | R14 | R15 | R16 | R17 | (HFG) | RE2 |
| | ACTb | H | R6 | R7 | R8 | R9 | R10 | R11 | V | RE3 |
| | | L | R0 | R1 | R2 | R3 | R4 | R5 | V | RE4 |
| RD | | H | L | L | L | BA0 | BA1 | BA2 | BA3 | RE1 |
| | | L | C4 | C5 | C6 | C7 | C8 | C9 | BL | RE2 |
| WR | | H | L | L | H | BA0 | BA1 | BA2 | BA3 | RE1 |
| | | L | C4 | C5 | C6 | C7 | C8 | C9 | BL | RE2 |
| MRW | MRWa | H | H | H | H | L | H | V | V | RE1 |
| | | L | MA0 | MA1 | MA2 | MA3 | MA4 | MA5 | (HFG) | RE2 |
| | MRWb | H | V | V | V | V | OP6 | OP7 | V | RE3 |
| | | L | OP0 | OP1 | OP2 | OP3 | OP4 | OP5 | V | RE4 |

FIG. 13

| MRSET | OP7 | OP6 | OP5 | OP4 | OP3 | OP2 | OP1 | OP0 |
|---|---|---|---|---|---|---|---|---|
| | TUF | THERMAL OFFSET | | PPRE | HFG | REFRESH RATE | | |

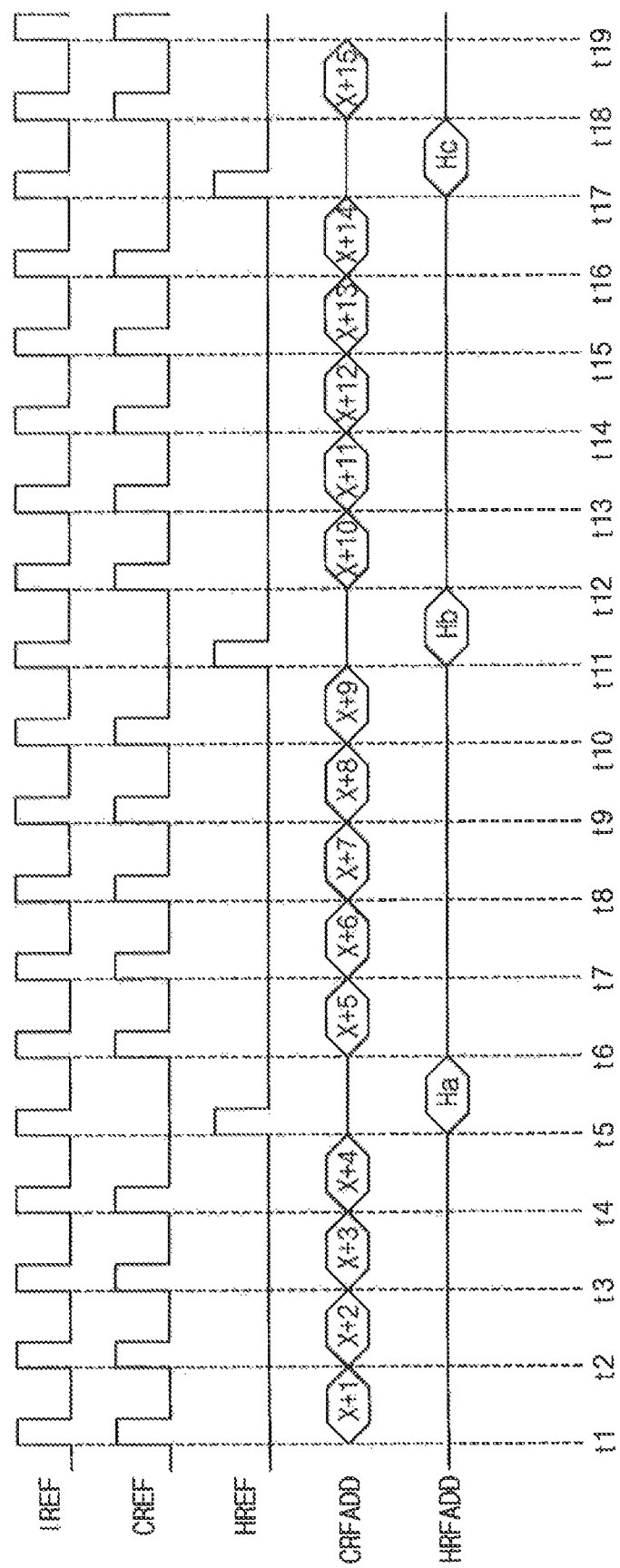

MEMORY DEVICE AND MEMORY SYSTEM PERFORMING A HAMMER REFRESH OPERATION AND ASSOCIATED OPERATIONS

CROSS-REFERENCE TO RELATED APPLICATION

This U.S. non-provisional application claims priority under 35 U.S.C. § 119 to Korean Patent Application No. 10-2016-0165419, filed on Dec. 6, 2016 in the Korean Intellectual Property Office (KIPO), the disclosure of which is incorporated by reference herein in its entirety.

TECHNICAL FIELD

Exemplary embodiments of the inventive concept relate to semiconductor integrated circuits, and more particularly, to a memory device performing a hammer refresh operation with respect to a row that is accessed intensively, a memory system including the memory device, and a method of operating the memory system.

DISCUSSION OF RELATED ART

Semiconductor memory devices for storing data may be classified into volatile memory devices and non-volatile memory devices. Volatile memory devices, such as dynamic random access memory (DRAM) devices, may be configured to store data by charging or discharging capacitors in memory cells, and lose the stored data when power is off. Non-volatile memory devices, such as flash memory devices, may maintain stored data even when power is off. Volatile memory devices are widely used as main memories of various apparatuses, and non-volatile memory devices are widely used for storing program code and/or data in various electronic devices, such as computers, mobile devices, etc.

In volatile memory devices, cell charges stored in a memory cell may be lost due to a leakage current. In addition, when a wordline is transitioned frequently between an active state and a precharged state (e.g., when the wordline has been accessed intensively or frequently), a memory cell connected to a wordline that is adjacent to the frequently accessed wordline may be affected and lose stored charges, potentially causing data loss. Charges stored in a memory cell may be maintained by recharging before data is lost due to leakage of the charges. Such recharge of cell charges is referred to as a refresh operation, and a refresh operation may be performed repeatedly before cell charges are significantly lost.

SUMMARY

According to an exemplary embodiment of the inventive concept, a memory system includes a memory controller and a memory device. The memory controller determines and provides a hammer address that is accessed intensively. The hammer address is an address that has an activation number or frequency greater than a predetermined threshold. The memory device generates a hammer refresh signal representing a timing for a hammer refresh operation to refresh a first row of the memory device that is physically adjacent to a second row of the memory device corresponding to the hammer address. The memory device performs the hammer refresh operation using the hammer address provided from the memory controller and the hammer refresh signal generated by the memory device.

According to an exemplary embodiment of the inventive concept, a memory device includes a hammer address storage and a timing controller. The hammer address storage stores a hammer address provided from a memory controller. The hammer address is an address that has an activation number or frequency greater than a predetermined threshold. The timing controller generates a hammer refresh signal using operational characteristics of the memory device. The hammer refresh signal represents a timing for a hammer refresh operation to refresh a row of the memory device that is physically adjacent to a row of the memory device corresponding to the hammer address. The memory device performs the hammer refresh operation using the hammer address provided from the memory controller and the hammer refresh signal generated by the memory device.

According to an exemplary embodiment of the inventive concept, a method of operating a memory device includes generating, by a memory controller, a hammer address, providing the hammer address from the memory controller to a memory device, generating, by the memory device, a hammer refresh signal representing a timing for a hammer refresh operation to refresh a row of the memory device that is physically adjacent to a row of the memory device corresponding to the hammer address, and performing, by the memory device, the hammer refresh operation using the hammer address provided from the memory controller and the hammer refresh signal generated by the memory device. The hammer address is an address that has an activation number or frequency greater than a predetermined threshold.

According to an exemplary embodiment of the inventive concept, a memory device includes a command decoder, a refresh controller, and a memory cell array. The command decoder generates an active signal and a refresh signal. The refresh controller receives the active signal, the refresh signal, and a hammer address, and generates a counter refresh signal, a counter refresh address signal, a hammer refresh signal, and a hammer refresh address signal in response to the active signal, the refresh signal, and the hammer address. The hammer address is an address that has an activation number or frequency greater than a predetermined threshold. The memory cell array receives the counter refresh signal, the counter refresh address signal, the hammer refresh signal, and the hammer refresh address signal. The hammer refresh signal represents a timing for a hammer refresh operation to refresh a first row of the memory cell array that is physically adjacent to a second row of the memory cell array corresponding to the hammer address. The hammer refresh address signal represents an address of the first row. The memory device is performs the hammer refresh operation using the hammer refresh signal and the hammer refresh address signal.

BRIEF DESCRIPTION OF THE DRAWINGS

The above and other features of the inventive concept will be more clearly understood by describing in detail exemplary embodiments thereof with reference to the accompanying drawings.

FIG. 9 illustrates example commands which may be used in a memory system according to an exemplary embodiment of the inventive concept.

FIG. 13 is a diagram illustrating a mode register including hammer flag information according to an exemplary embodiment of the inventive concept.

FIGS. 15A, 15B, and 15C are timing diagrams illustrating operations of a refresh controller included in the memory device of FIG. 14 according to an exemplary embodiment of the inventive concept.

DETAILED DESCRIPTION OF THE EMBODIMENTS

Figure 1:
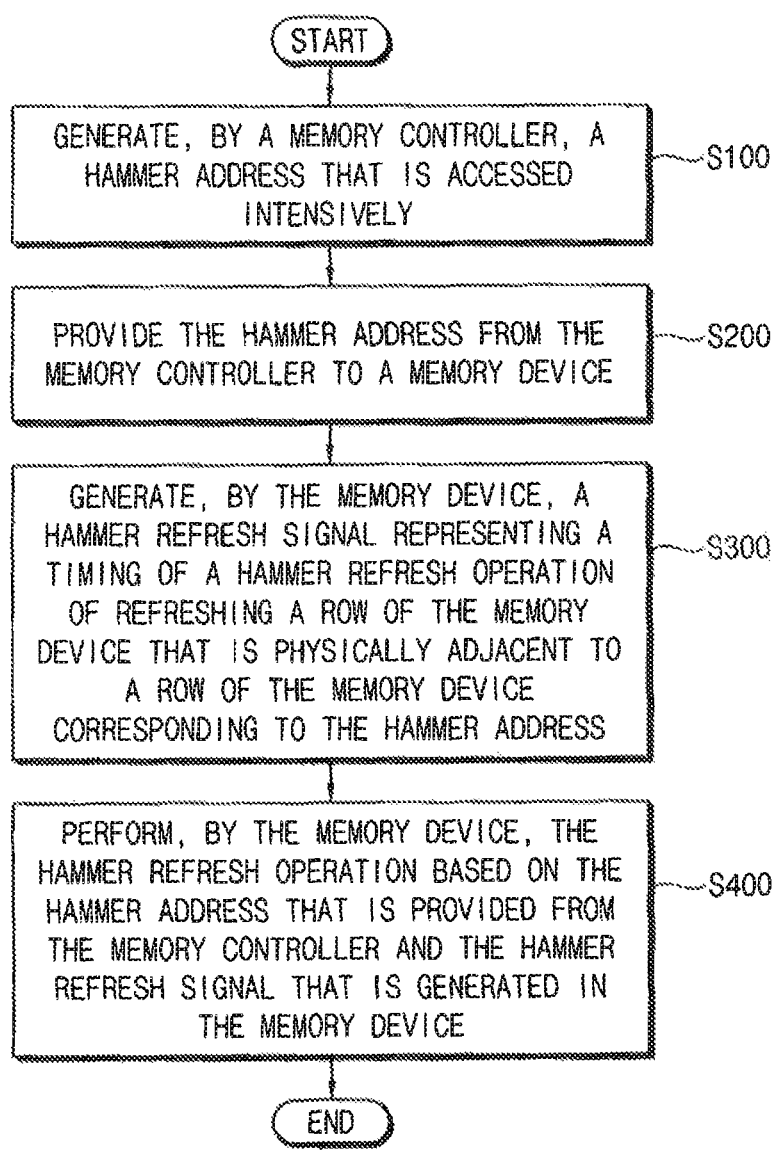
FIG. 1 is a flowchart illustrating a method of operating a memory system according to an exemplary embodiment of the inventive concept.

Exemplary embodiments of the inventive concept will be described more fully hereinafter with reference to the accompanying drawings. In the drawings, like reference numerals may refer to like elements throughout this application. Repeat descriptions may be omitted.

Exemplary embodiments of the inventive concept provide a memory device and a memory system including the memory device capable of efficiently performing a hammer refresh operation with respect to a row or a wordline that is accessed intensively.

Exemplary embodiments of the inventive concept also provide a method of operating the above-described memory system capable of efficiently performing the hammer refresh operation.

FIG. 1 is a flowchart illustrating a method of operating a memory system according to an exemplary embodiment of the inventive concept.

Referring to FIG. 1, in a memory system including a memory controller and a memory device, the memory controller generates a hammer address that is accessed intensively (S100), and the hammer address is provided from the memory controller to the memory device (S200). The hammer address will be described below with reference to FIG. 6 and the transfer of the hammer address will be described below with reference to FIGS. 7 through 13.

The memory device generates a hammer refresh signal representing a timing for a hammer refresh operation to refresh a row of the memory device that is physically adjacent to a row of the memory device corresponding to the hammer address (S300). The memory device performs the hammer refresh operation based on the hammer address provided from the memory controller and the hammer refresh signal generated by the memory device (S400). The generation of the hammer refresh signal and the execution of the hammer refresh operation will be described below with reference to FIGS. 14 through 17B.

A volatile memory device such as a dynamic random access memory (DRAM) performs a refresh operation periodically due to charge leakage of memory cells storing data. Due to scale down of the manufacturing process of the DRAM, the storage capacitance of the memory cell is decreased and the refresh period is shortened. When memory capacity of the DRAM is increased, the refresh period is further shortened because the entire refresh time is increased.

To compensate for degradation of adjacent memory cells due to the intensive access of a particular row or a hammer address, a target row refresh (TRR) scheme may be adopted and an in-memory refresh scheme used to reduce the burden of the memory controller. The memory controller is totally responsible for the hammer refresh operation in the TRR scheme and the memory device is totally responsible for the hammer refresh operation in the in-memory refresh scheme. The chip size overhead for the in-memory refresh operation may be large as the memory capacity is increased and demands on low power consumption of the memory device is increased. In addition, the power consumption may be increased because the memory device is responsible for the hammer refresh operation even though there is no intensive access.

The above-described method of operating the memory system according to an exemplary embodiment of the inventive concept may perform the hammer address detection and the refresh execution in the memory controller and the memory device, respectively, to distribute the burden of the hammer refresh operation, thus reducing a size of the memory device and enhancing overall performance of the memory system.

Figure 2:
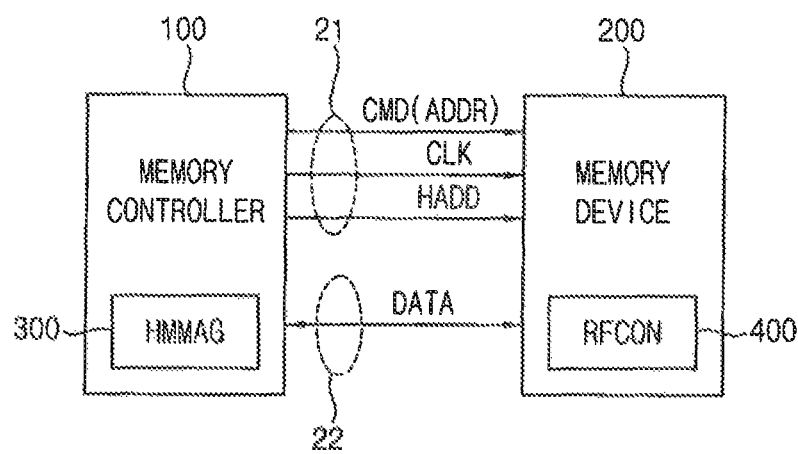
FIG. 2 is a block diagram illustrating a memory system according to an exemplary embodiment of the inventive concept.

FIG. 2 is a block diagram illustrating a memory system according to an exemplary embodiment of the inventive concept.

Referring to FIG. 2, a memory system 10 includes a memory controller 100 and a memory device 200. The memory controller 100 and the memory device 200 include interfaces for mutual communication. The interfaces may be connected through a control bus 21 for transferring a command CMD, an access address ADDR, a clock signal CLK, a hammer address HADD, etc. and a data bus 22 for transferring data DATA. According to some standards for memory devices, the access address ADDR may be incorporated in the command CMD (e.g., CMD(ADDR)). The memory controller 100 may generate the command CMD to control the memory device 200 and the data DATA may be written in or read from the memory device 200 under the direction and control of the memory controller 100.

According to an exemplary embodiment of the inventive concept, the memory controller 100 may include a hammer address manager HMMAG 300 configured to provide the hammer address HADD and the memory device 200 may include a refresh controller RFCON 400 configured to perform the hammer refresh operation based on the hammer address HADD. The hammer address detection and the hammer refresh execution may be performed by the memory controller and the memory device, respectively, to distribute the burden of the hammer refresh operation, thus reducing the size of the memory device and enhancing overall performance of the memory system.

Figure 3:
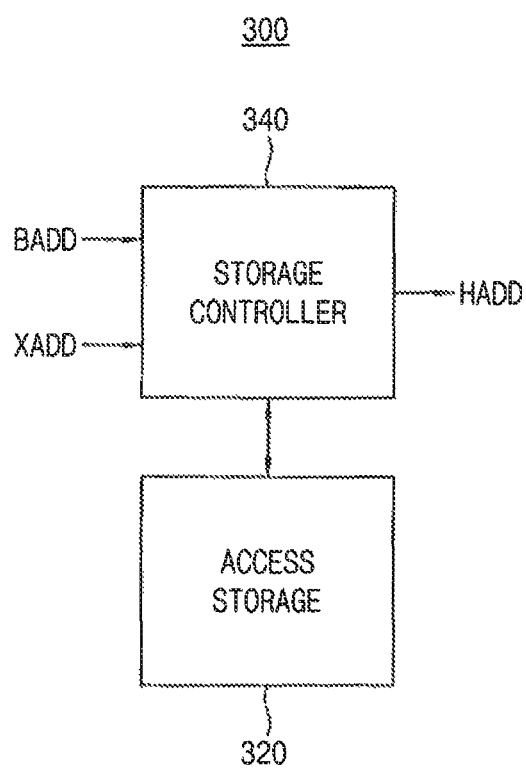
FIG. 3 is a block diagram illustrating a hammer address manager included in the memory controller of FIG. 2 according to an exemplary embodiment of the inventive concept.
Figure 4:
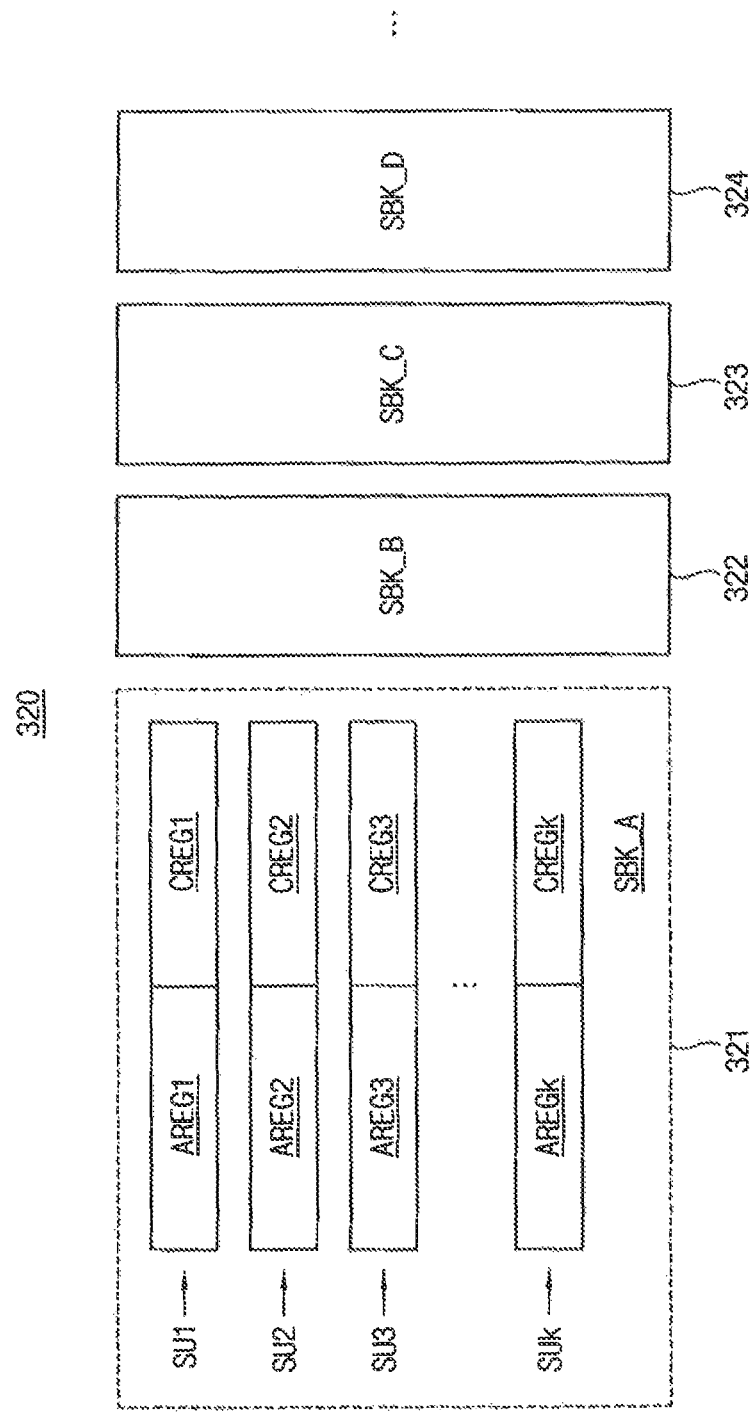
FIG. 4 is a block diagram illustrating an access storage included in the hammer address manager of FIG. 3 according to an exemplary embodiment of the inventive concept.

FIG. 3 is a block diagram illustrating a hammer address manager included in the memory controller of FIG. 2, and FIG. 4 is a block diagram illustrating an access storage included in the hammer address manager of FIG. 3, according to exemplary embodiments of the inventive concept.

Referring to FIG. 3, the hammer address manager 300 may include an access storage 320 and a storage controller 340.

The access storage 320 may store the information with respect to the hammer address HADD that is accessed intensively or frequently. According to exemplary embodiments of the inventive concept, the access storage 320 may include a plurality of storage blocks 321, 322, 323, and 324 (also referred to as SBK_A, SBK_B, SBK_C, and SBK_D), and each of the storage blocks 321, 322, 323, and 324 may include a plurality of storage units SU1~SUk as illustrated in FIG. 4.

FIG. 4 illustrates a non-limiting example of the access storage 320 corresponding to four memory banks A, B, C, and D. The number of storage blocks may be changed depending on the configuration of the memory device 200. For example, if the memory device 200 has a single-bank structure, the access storage 320 may include only one storage block 321. In the present exemplary embodiment, the storage blocks 321, 322, 323, and 324 may have substantially the same configuration, and thus, only the storage block 321 will be described.

The storage units SU1~SUk may include address registers AREG1~AREGk, respectively, storing row addresses that are accessed and count registers CREG1~CREGk, respectively, storing access count values corresponding to the row addresses.

The storage controller 340 may control the access storage 320 based on an access address signal that is transferred from the memory controller 100 to the memory device 200. The access address may include a bank address BADD and a row address XADD. According to an exemplary embodiment of the inventive concept, the bank address BADD may be omitted if the memory device 200 has a single memory bank. The storage controller 340 may determine and provide the hammer address HADD among the stored access addresses based on the access count values. The management scheme of the hammer address HADD used by the storage controller 340 may be determined variously depending on the memory system 10.

Figure 5:
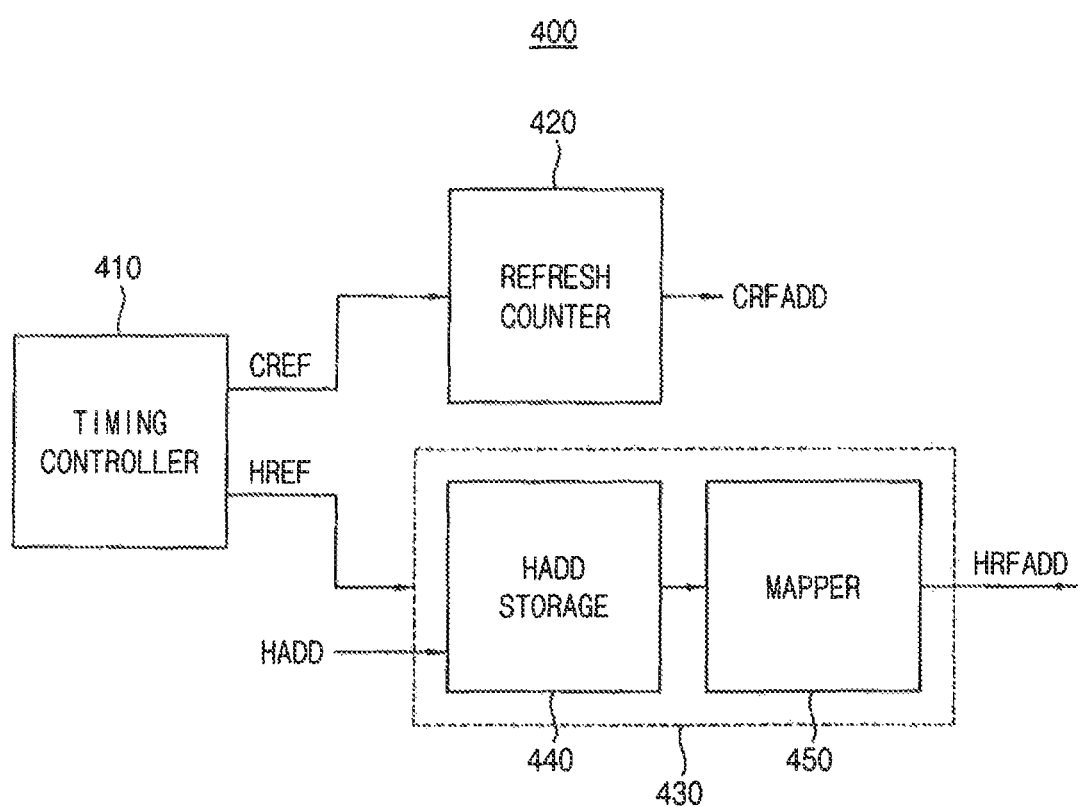
FIG. 5 is a block diagram illustrating a refresh controller included in the memory device of FIG. 2 according to an exemplary embodiment of the inventive concept.

FIG. 5 is a block diagram illustrating a refresh controller included in the memory device of FIG. 2 according to an exemplary embodiment of the inventive concept.

Referring to FIG. 5, the refresh controller 400 may include a timing controller 410, a refresh counter 420, and an address generator 430.

Figure 15B:
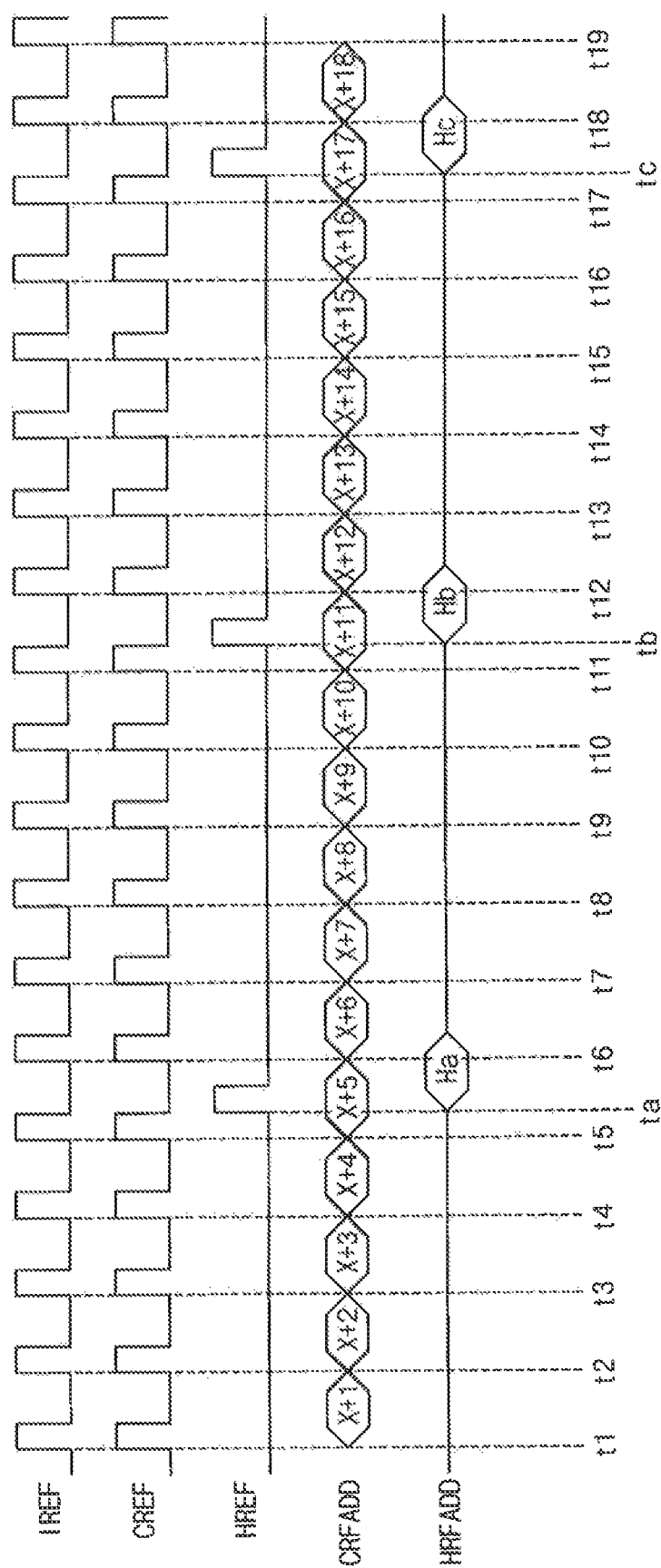
Figure 15C:
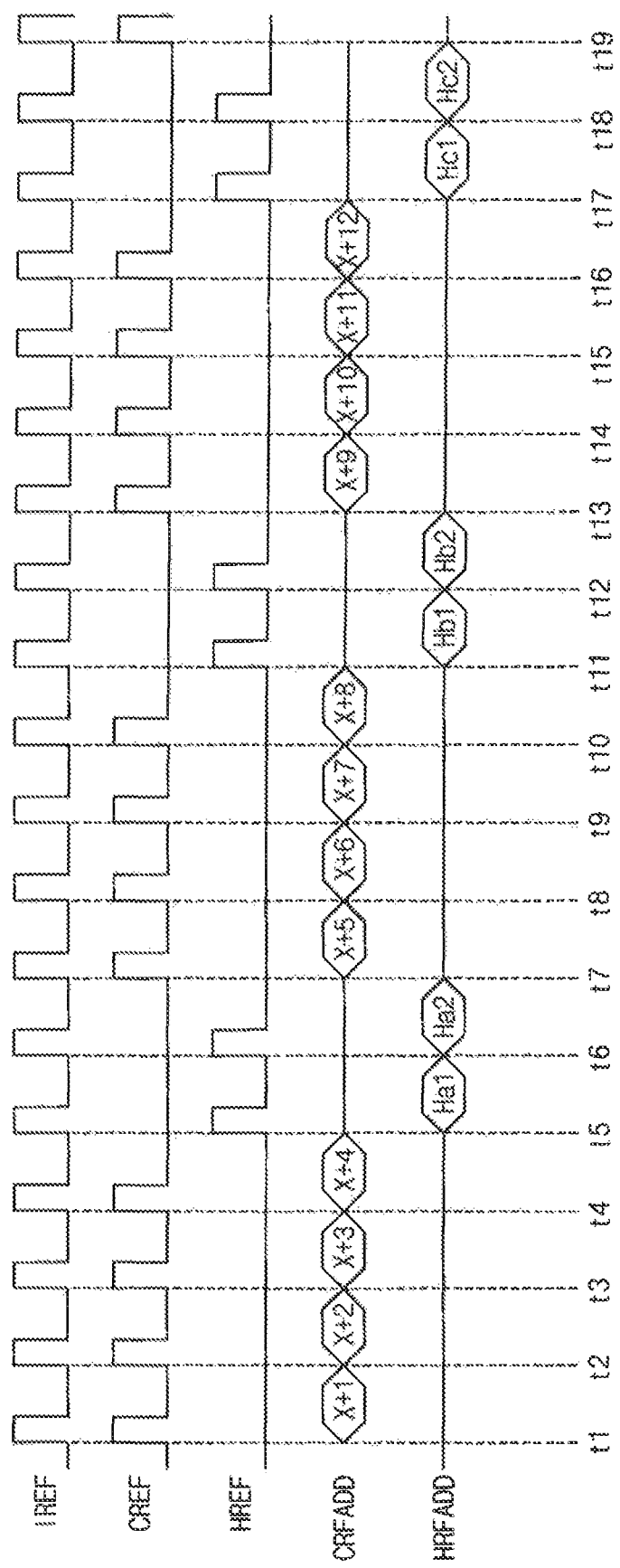

The timing controller 410 may generate a counter refresh signal CREF and a hammer refresh signal HREF representing a timing of the hammer refresh operation based on operational characteristics of the memory device 200. The operation of the timing controller 410 will be further described below with reference to FIGS. 15A, 15B, and 15C. As illustrated in FIGS. 15A, 15B, and 15C, the timing controller 410 may selectively activate one of the counter refresh signal CREF and the hammer refresh signal HREF.

According to exemplary embodiments of the inventive concept, as illustrated in FIG. 5, the timing controller 410 may be included in the refresh controller 400. According to exemplary embodiments of the inventive concept, the timing controller 410 may be omitted and the counter refresh signal CREF and the hammer refresh signal HREF may be provided from other control logics in a memory device.

The refresh counter 420 may generate a counter refresh address signal CRFADD in response to the counter refresh signal CREF where the counter refresh address signal CRFADD may represent a sequentially changing address. For example, the refresh counter 420 may increase a value of the counter refresh address signal CRFADD whenever the counter refresh signal CREF is activated. Wordlines in a memory cell array of the memory device 200 may be selected sequentially for refresh operations by increasing the value of the counter refresh address signal CRFADD.

The address generator 430 may store the hammer address HADD provided from the memory controller 100 and may generate a hammer refresh address signal HRFADD in synchronization with the hammer refresh signal HREF. The hammer refresh address signal HRFADD may correspond to an address of a row that is physically adjacent to the row corresponding to the hammer address HADD. The address generator 430 may include a hammer address storage 440 and a mapper 450.

The hammer address storage 440 may store the hammer address HADD provided from the memory controller 100. According to exemplary embodiments of the inventive concept, the hammer address storage 440 may include storage units for storing a plurality of addresses, which will be described with reference to FIG. 8.

The mapper 450 may generate the hammer refresh address signal HRFADD based on the hammer address HADD provided from the hammer address storage 440. As will be described below with reference to FIG. 6, the hammer refresh address signal HRFADD may indicate an address of the row of the memory device 200 that is physically adjacent to the row of the memory device 200 corresponding to the hammer address HADD. According to exemplary embodiments of the inventive concept, the mapper 450 may provide an address corresponding to one of the two adjacent rows in response to the hammer refresh signal HREF, as will be described below with reference to FIGS. 15A and 15B. According to exemplary embodiments of the inventive concept, the mapper 450 may sequentially provide addresses corresponding to the two adjacent rows in response to the hammer refresh signal HREF, as will be described below with reference to FIG. 15C.

Figure 6:
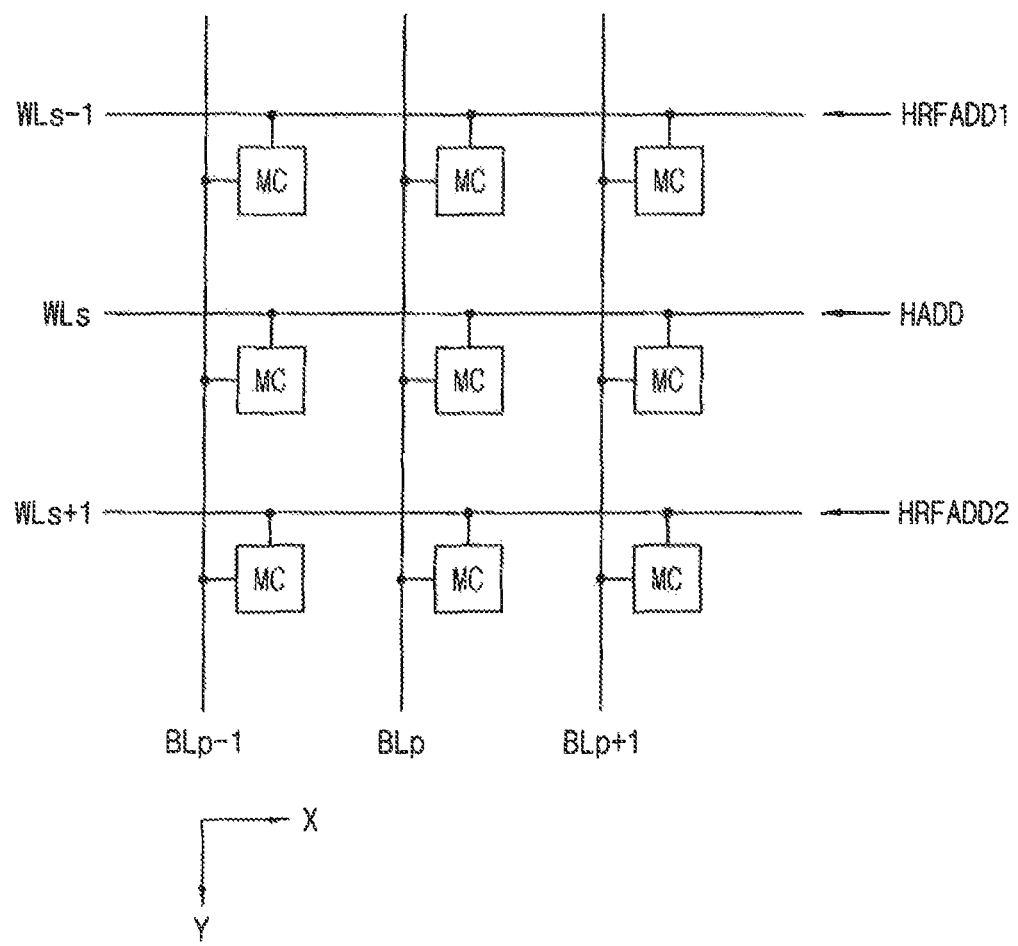
FIG. 6 is a diagram illustrating a portion of a memory cell array for describing a data loss due to wordline coupling.

FIG. 6 is a diagram illustrating a portion of a memory cell array for describing a data loss due to wordline coupling.

FIG. 6 illustrates three wordlines WLs−1, WLs, and WLs+1, three bitlines BLp−1, BLp, and BLp+1, and memory cells MC coupled to the wordlines WLs−1, WLs, and WLs+1 and the bitlines BLp−1, BLp, and BLp+1 in the memory cell array. The three wordlines WLs−1, WLs, and WLs+1 are extended in a row direction (e.g., X direction) and arranged sequentially along a column direction (e.g., Y direction). The three bitlines BLp−1, BLp, and BLp+1 are extended in the column direction and arranged sequentially along the row direction. It will be understood here that the wordlines WLs−1 and WLs are directly physically adjacent to each other since there are no intervening wordlines between the wordlines WLs−1 and WLs.

For example, the middle wordline WLs may correspond to the hammer address HADD that has been accessed intensively. It will be understood that an intensively-accessed or hammer wordline refers to a wordline that has a relatively higher activation number and/or has a relatively higher activation frequency (e.g., greater than a predetermined threshold). Whenever the hammer wordline (e.g., the middle wordline WLs) is accessed, the hammer wordline WLs is enabled and precharged, and the voltage level of the hammer wordline WLs is increased and decreased. Wordline coupling may cause the voltage levels of the adjacent wordlines WLs−1 and WLs+1 to fluctuate as the voltage level of the hammer wordline WLs varies, and thus, the cell charges of the memory cells MC coupled to the adjacent wordlines WLs−1 and WLs+1 are affected. As the hammer wordline WLs is accessed more frequently, the cell charges of the memory cells MC coupled to the adjacent wordlines WLs−1 and WLs+1 may be lost more rapidly.

The address generator 430 of FIG. 5 may provide the hammer refresh address signal HRFADD representing addresses HRFADD1 and HRFADD2 of the rows (e.g., the wordlines WLs−1 and WLs+1) that are physically adjacent to the row of the hammer address HADD (e.g., the middle wordline WLs), and a refresh operation for the adjacent wordlines WLs−1 and WLs+1 may be performed based on (e.g., in response to) the hammer refresh address signal HRFADD to reduce or possibly prevent the loss of data stored in the memory cells MC.

Figure 7:
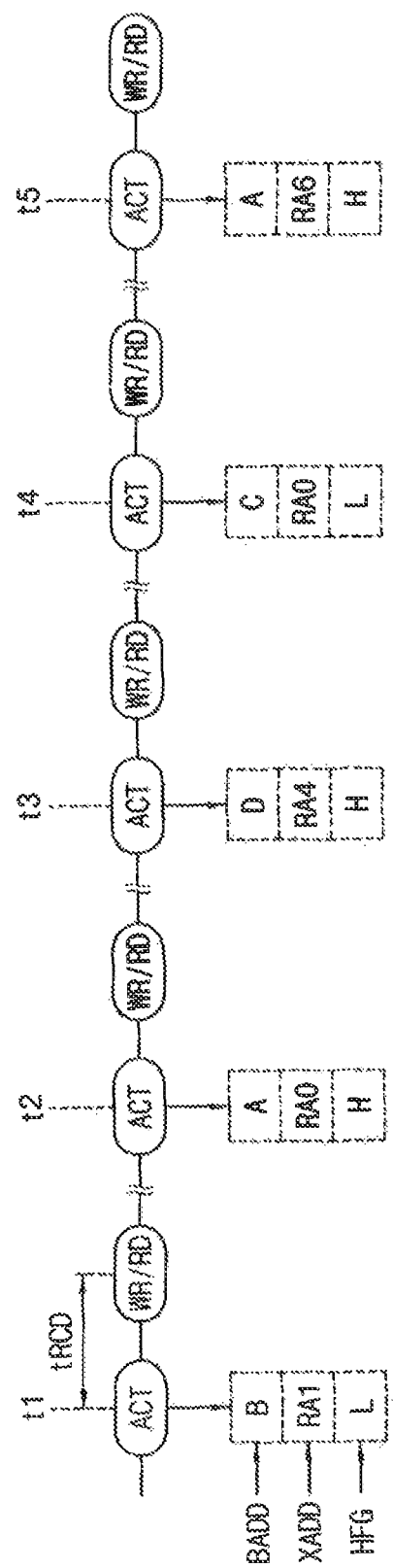
FIG. 7 is a diagram illustrating a method of providing a hammer address according to an exemplary embodiment of the inventive concept.

FIG. 7 is a diagram illustrating a method of providing a hammer address according to an exemplary embodiment of the inventive concept.

FIG. 7 illustrates an example where the memory controller 100 provides the hammer address HADD in real time using an active command ACT for an access operation of the memory device 200.

Referring to FIGS. 2 and 7, the memory controller 100 transfers the active command ACT to the memory device 200 for the access operation at time points t1~t5. The access operation may include a write operation to store data in the memory device 200 and a read operation to read out data from the memory device 200.

In general, the active command ACT may accompany an access address (e.g., the bank address BADD and the row address XADD). The access address BADD and XADD may be included in the active command ACT. Alternatively, the access address BADD and XADD may be transferred from the memory controller 100 to the memory device 200 in synchronization with a transfer timing of the active command ACT, even though the access address BADD and XADD is not included in the active command ACT.

The access address may include only the row address XADD in case of a single-bank structure, and the access address may include the bank address BADD in addition to the row address XADD in case of a multi-bank structure. The access operation with respect to the row corresponding to the access address BADD and XADD may be performed in synchronization with the active command ACT provided to the memory device 200.

After a RAD-to-CAD delay time tRCD from each of the time points t1~t5, the memory controller 100 transfers a write command WR or a read command RD to the memory device 200 to perform a write operation or a read operation, respectively, with respect to a column address accompanied by the write command WR or a read command RD.

As such, the memory controller 100 may transfer the read command RD or the write command WR to the memory device 200 after the memory controller 100 transfers the active command ACT to sequentially perform the row access and the column access.

According to an exemplary embodiment of the inventive concept, the active command ACT may include hammer flag information HFG indicating whether the access address BADD and XADD accompanied by the active command ACT corresponds to the hammer address HADD (e.g., "H") or not (e.g., "L"). The memory device 200 may determine whether to store the access address BADD and XADD accompanied by the active command ACT as the hammer address HADD based on the hammer flag information HFG.

Figure 8:
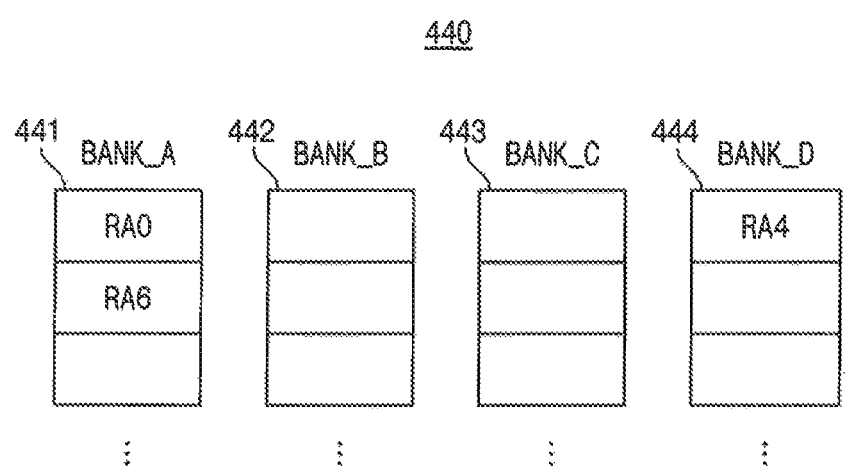
FIG. 8 is a diagram illustrating a storage state of a hammer address storage of FIG. 5 using the method of FIG. 7 according to an exemplary embodiment of the inventive concept.

FIG. 8 is a diagram illustrating a storage state of a hammer address storage of FIG. 5 using the method of FIG. 7 according to an exemplary embodiment of the inventive concept.

As illustrated in FIG. 8, the hammer address storage 440 included in the refresh controller 400 of the memory device 200 may include a plurality of storage blocks 441, 442, 443, and 444 corresponding to a plurality of memory banks A, B, C, and D, respectively. FIG. 8 illustrates a non-limiting example with four memory banks A, B, C, and D. However, the inventive concept is not limited thereto, and the number of storage blocks may be changed depending on the configuration of the memory device 200. If the memory device 200 has a single-bank structure, the hammer address storage 440 may include only one storage block.

When the hammer flag information HFG has a first value (e.g., "H"), the memory device 200 may perform the access operation based on the access address BADD and XADD accompanied by the active command ACT and may store the access address BADD and XADD as the hammer address HADD. In contrast, when the hammer flag information HFG has a second value (e.g., "L"), the memory device 200 may perform the access operation based on the access address BADD and XADD accompanied by the active command ACT and may not store the access address BADD and XADD as the hammer address HADD.

For example, as illustrated in FIGS. 7 and 8, the hammer flag information HFG included in the active command ACT may have the first value, for example, a logic high value "H", and thus, the memory device 200 may store the row address XADD accompanied by the active command ACT in a storage block of the hammer address storage 440 corresponding to the bank address BADD. In other words, the row address RA0 at time point t2 is stored in the storage block 441 corresponding to the memory bank A, the row address RA4 at time point t3 is stored in the storage block 444 corresponding to the memory bank D, and the row address RA6 at time point t5 is stored in the storage block 441 corresponding to the memory bank A.

In contrast, the hammer flag information HFG included in the active command ACT may have the second value, for example, a logic low value "L", and thus, the memory device 200 may not store the row address XADD accompanied by the active command ACT in the hammer address storage 440. In other words, the access address B and RA1 at time point t1 and the access address C and RA0 at time point t4 are used for the general access operation and are not stored as the hammer address HADD.

As such, by using the active command ACT including the hammer flag information HFG for the general access operation, the hammer address HADD may be provided from the memory controller 100 to the memory device 200 without additional time loss.

FIG. 9 illustrates example commands which may be used in a memory system according to an exemplary embodiment of the inventive concept.

FIG. 9 illustrates combinations of a chip selection signal CS and command-address signals CA0~CA6 representing the active command ACT, the read command RD, the write command WR, and a mode register write command MRW. In FIG. 9, H indicates the logic high level, L indicates the logic low level, R0~R17 indicate bits of a row address RA, BA0~BA3 indicate bits of a bank address BA, V indicates any one of the logic low level and the logic high level, BL indicates a burst length, C4~C9 indicate bits of a column address CA, MA0~MA5 indicate a location of the mode register in which a mode register write operation is performed, OP0~OP7 indicate the mode information to be written in the mode register, and RE1~RE4 indicate first through fourth rising edges of a clock signal CK.

The active command ACT may include a first portion ACTa and a second portion ACTb, and the active command ACT may be transferred during a plurality of clock cycles, for example, four clock cycles (e.g., RE1 to RE4). The active command ACT may include the bank address bits BA0~BA3 and the row address bits R0~R17. Additionally, the active command ACT may include the hammer flag information HFG representing whether the access address accompanied by the active command ACT corresponds to the hammer address HADD or not. FIG. 9 illustrates the hammer flag information HFG having one bit as a non-limiting example. According to exemplary embodiments of the inventive concept, the hammer flag information HFG may be implemented with multiple bits.

The first value (e.g., the logic high value H) of the hammer flag information HFG in the active command ACT may indicate that the accompanied access address corresponds to the hammer address HADD, and the second value (e.g., the logic low value L) of the hammer flag information HFG in the active command ACT may indicate that the accompanied access address does not correspond to the hammer address HADD.

Each of the read command RD and the write command WR may include the bank address bits BA0~BA3 and the column address bits C4~C9 and may be transferred during a plurality of clock cycles, for example, two clock cycles (e.g., RE1 and RE2).

The mode register write command MRW may include a first portion MRWa and a second portion MRWb. The mode register write command MRW may be transferred during a plurality of clock cycles, for example, four clock cycles (e.g., RE1 to RE4). The mode register write command MRW may include the mode register location bits MA0~MA5 and the mode information bits OP0~OP7. Additionally, the mode register write command MRW may include the hammer flag information HFG for setting an operation mode of the memory device 200.

The first value (e.g., the logic high value H) of the hammer flag information HFG in the mode register write command MRW may indicate that the operation mode of the memory device 200 is a hammer mode, and the second value (e.g., the logic low value L) of the hammer flag information HFG in the mode register write command MRW may indicate that the operation mode is a normal access mode. By including the hammer flag information HFG in the mode register write command MRW, different methods of providing the hammer address HADD may be implemented as will be described below with reference to FIGS. 12 and 13.

FIG. 9 illustrates non-limiting examples of combinations of the chip selection signal CS and the command-address signals CA0~CA6. The inventive concept is not limited thereto and combinations of these signals representing different commands may be changed in various ways.

Figure 10A:
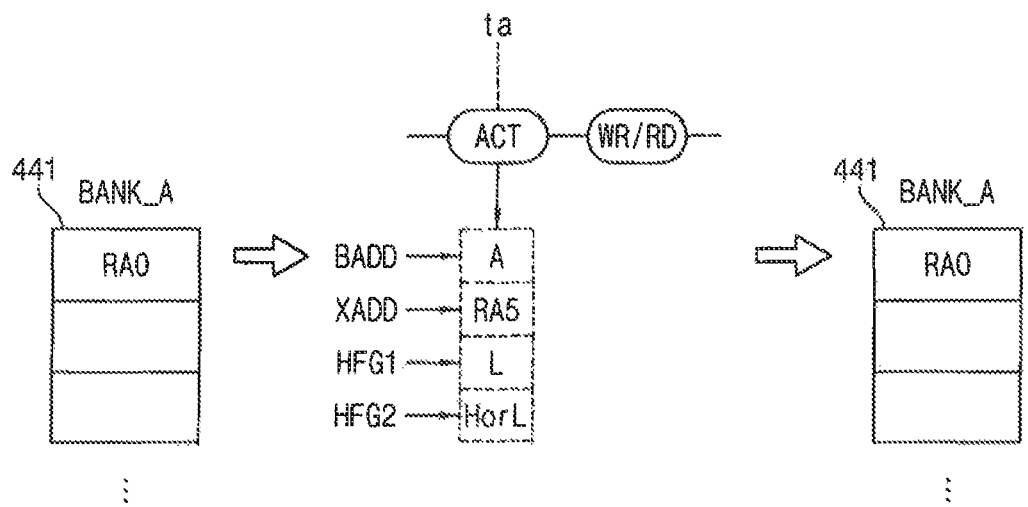
FIGS. 10A, 10B, and 10C are diagrams illustrating exemplary embodiments of the inventive concept to provide a hammer address and a corresponding storage state of a hammer address storage.
Figure 10B:
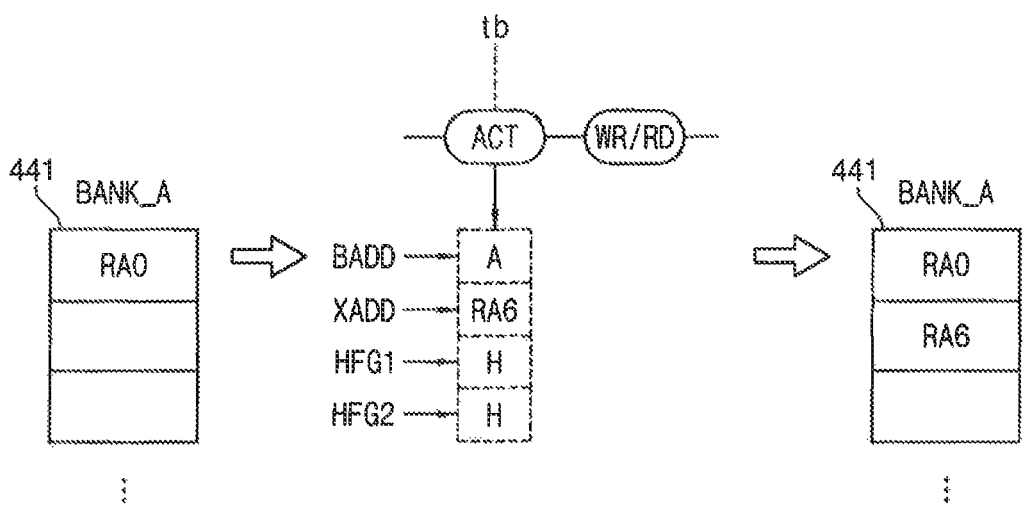
Figure 10C:
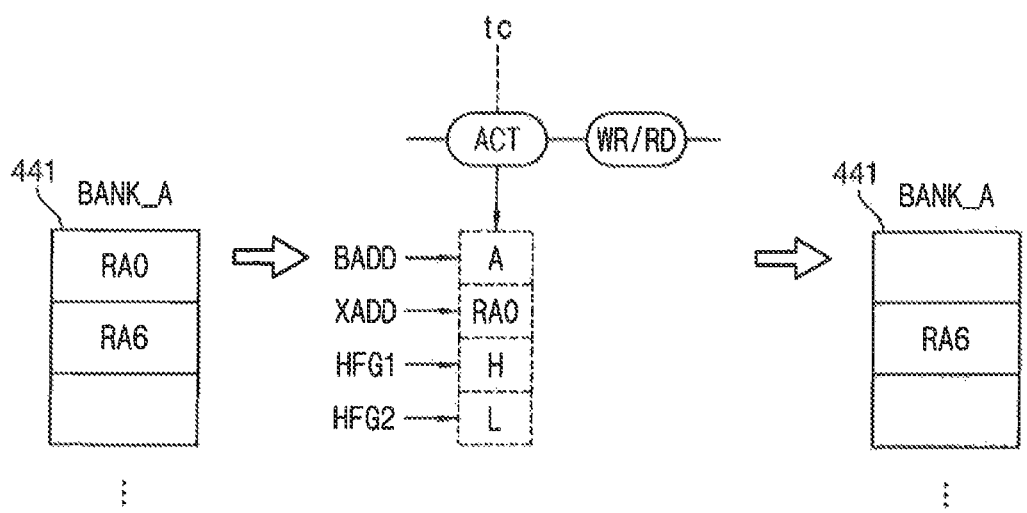

FIGS. 10A, 10B, and 10C are diagrams illustrating exemplary embodiments of the inventive concept to provide a hammer address and a corresponding storage state of a hammer address storage. The exemplary embodiments of FIGS. 10A, 10B, and 10C are similar to the exemplary embodiments of FIGS. 7, 8, and 9, and thus, repeat descriptions may be omitted.

For convenience of illustration and description, FIGS. 10A, 10B, and 10C illustrate only the storage block 441, corresponding to the memory bank A, among the plurality of storage blocks 441, 442, 443, and 444 included in the hammer address storage 440 of FIG. 8. In addition, FIGS. 10A, 10B, and 10C illustrate a storage state of the storage block 441 before and after the transfer of the active command ACT.

The hammer flag information HFG of FIGS. 10A, 10B, and 10C is implemented with first and second hammer flag bits HFG1 and HFG2 whereas the hammer flag information HFG of FIGS. 7, 8, and 9 is implemented with a single bit. For example, the first hammer flag bit HFG1 may indicate whether the access address BADD and XADD accompanied by the active command ACT is relevant to the hammer address HADD or not, and the second hammer flag bit HFG2 may indicate whether the access address BADD and XADD is to be included in or excluded from the hammer address HADD.

Referring to FIG. 10A, at time point to of transferring the active command ACT, the bank address BADD having the value A, the row address XADD having the value RA5, and the first hammer flag bit HFG1 having the second value L are accompanied by the active command ACT and provided from the memory controller 100 to the memory device 200. The memory device 200 determines, according to the second value L of the first hammer flag bit HFG1 (and regardless of the value of the second hammer flag bit HFG2), that the access address BADD and XADD accompanied by the active command ACT is irrelevant to the hammer address HADD. In other words, the storage state of the storage block 441 corresponding to the bank address BADD having the value A (e.g., BANK_A) is maintained and not changed.

Referring to FIG. 10B, at time point tb of transferring the active command ACT, the bank address BADD having the value A, the row address XADD having the value RA6, and the first hammer flag bit HFG1 having the first value H are accompanied by the active command ACT and provided from the memory controller 100 to the memory device 200. The memory device 200 determines, according to the first value H of the first hammer flag bit HFG1, that the access address BADD and XADD accompanied by the active command ACT is relevant to the hammer address HADD, and thus, the memory device 200 may perform an operation relevant to the hammer address HADD in addition to the normal access operation.

For example, when the second hammer flag bit HFG2 has the first value H, the memory device 200 may cause the access address BADD and XADD to be included in the hammer address HADD. In other words, the row address RA6 accompanied by the active command ACT may be newly written in the storage block 441 corresponding to the bank address BADD having the value A (e.g., BANK_A).

Referring to FIG. 10C, at time point tc of transferring the active command ACT, the bank address BADD having the value A, the row address XADD having the value RA0, and the first hammer flag bit HFG1 having the first value H are accompanied by the active command ACT and provided from the memory controller 100 to the memory device 200. The memory device 200 determines, according to the first value H of the first hammer flag bit HFG1, that the access address BADD and XADD accompanied by the active command ACT is relevant to the hammer address HADD, and thus, the memory device 200 may perform an operation relevant to the hammer address HADD in addition to the normal access operation.

For example, when the second hammer flag bit HFG2 has the second value L, the memory device 200 may cause the access address BADD and XADD to be excluded from the hammer address HADD. In other words, the row address RA0 accompanied by the active command ACT may be deleted from the storage block 441 corresponding to the bank address BADD having the value A (e.g., BANK_A).

Figure 11:
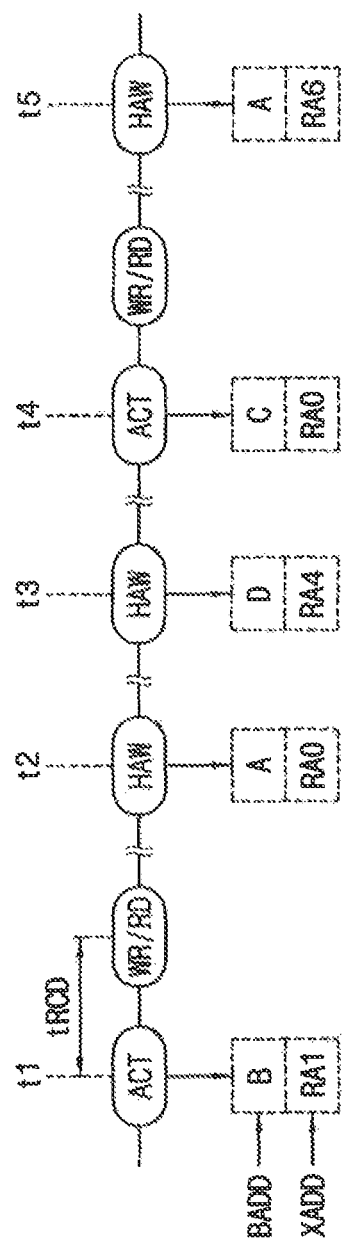
FIGS. 11 and 12 are diagrams illustrating a method of providing a hammer address according to exemplary embodiments of the inventive concept.
Figure 12:
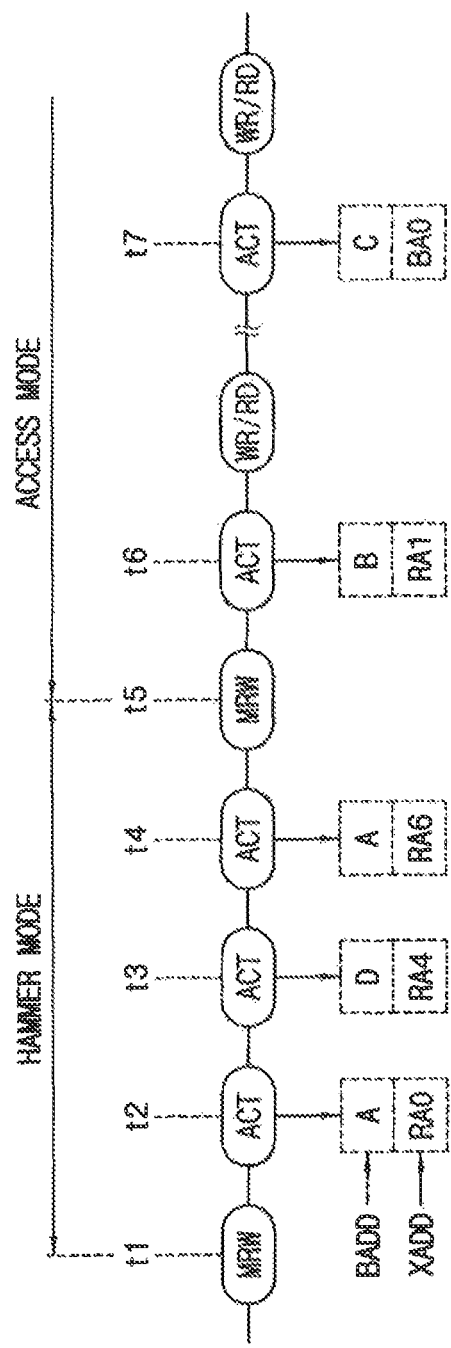

FIGS. 11 and 12 are diagrams illustrating a method of providing a hammer address according to exemplary embodiments of the inventive concept. Hereinafter, repeat descriptions of elements similar to those in FIG. 7 may be omitted.

FIG. 11 illustrates an example where the memory controller 100 provides the hammer address HADD in real time using a hammer address write command HAW, irrelevant to an access operation of the memory device 200. As described with reference to FIG. 9, the hammer address write command HAW may be defined by a combination of the chip selection signal CS and the command-address signals CA0~CA6 that is distinct from combinations of the other commands.

Referring to FIGS. 2 and 11, the memory controller 100 may sequentially transfer the active command ACT and the write or read command WR or RD at time points t1 and t4 for the access operation as described above. The memory device 200 may perform the row access and the column access sequentially based on the sequentially transferred commands.

Additionally, the memory controller 100 may transfer the hammer address write command HAW for providing the hammer address HADD at time points t2, t3, and t5. The write command WR or the read command RD does not follow the hammer address write command HAW because the hammer address write command HAW is irrelevant to the access operation. The memory device 200 may store an address accompanied by the hammer address write command HAW as the hammer address HADD. In other words, as illustrated in FIG. 8, the row address RA0 at time point t2 is stored in the storage block 441 corresponding to the memory bank A, the row address RA4 at time point t3 is stored in the storage block 444 corresponding to the memory bank D, and the row address RA6 at time point t5 is stored in the storage block 441 corresponding to the memory bank A.

FIG. 12 illustrates an example where the memory controller 100 sets an operation mode of the memory device 200 to a hammer mode and provides the hammer address HADD during the hammer mode. As described with reference to FIGS. 7 through 11, the hammer address HADD is provided in real time or on the fly from the memory controller 100 to the memory device 200. In contrast, in FIG. 12, the hammer address HADD is provided from the memory controller 100 to the memory device 200 only during the hammer mode. For example, a process included with the memory controller 100 in a host device may predict an address associated with data that is accessed intensively, and may determine and provide the address associated with the intensively-accessed data as the hammer address HADD to the memory device 200.

According to an exemplary embodiment of the inventive concept, the memory device 200 may include a mode register configured to store values for controlling the memory device 200, and the memory controller 100 may write the hammer flag information HFG in the mode register using the mode register write command MRW to start or finish the hammer mode.

Referring to FIGS. 2 and 12, the memory controller 100 may transfer the mode register write command MRW for starting the hammer mode at time point t1 and transfer the mode register write command MRW for finishing the hammer mode at time point t5. As described with reference to FIG. 9, the first value (e.g., the logic high value H) of the hammer flag information HFG in the mode register write command MRW may indicate that the operation mode of the memory device 200 is the hammer mode, and the second value (e.g., the logic low value L) of the hammer flag information HFG in the mode register write command MRW may indicate that the operation mode is the normal access mode. The start and finish time points may be determined by using the mode register write command MRW including the hammer flag information HFG.

For example, the memory controller 100 may provide the hammer address HADD to the memory device 200 during the hammer mode (time points t1~t5) by using the active command ACT. The active command ACT transferred during the hammer mode is irrelevant to the access operation, and thus, during the hammer mode, the memory controller 100 does not transfer the read command RD or the write command WR to the memory device 200 after transferring the active command ACT including the hammer address HADD.

During the hammer mode, the memory device 200 may store the row address XADD accompanied by the active command ACT as the hammer address HADD. In other words, as illustrated in FIG. 8, the row address RA0 at time point t2 is stored in the storage block 441 corresponding to the memory bank A, the row address RA4 at time point t3 is stored in the storage block 444 corresponding to the memory bank D, and the row address RA6 at time point t5 is stored in the storage block 441 corresponding to the memory bank A.

The access operation may be performed during the normal access mode after the hammer mode. At time points t6 and t7, the active command ACT and the write or read command WR or RD may be transferred sequentially from the memory controller 100 to the memory device 200. The memory device 200 may perform the row access and the column access sequentially based on the sequentially transferred commands.

Figure 14:
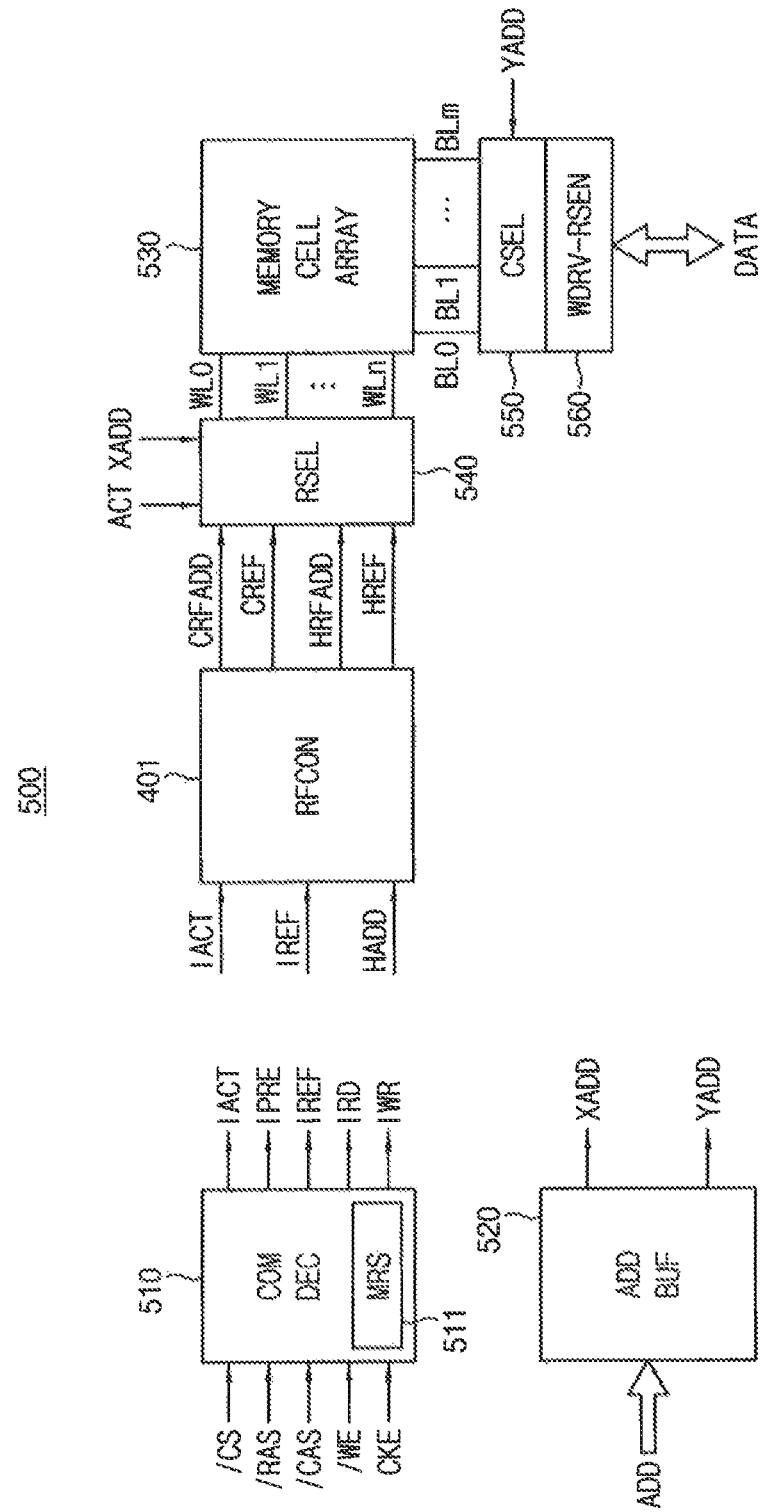
FIG. 14 is a block diagram illustrating a memory device according to an exemplary embodiment of the inventive concept.

FIG. 13 is a diagram illustrating a mode register including hammer flag information according to an exemplary embodiment of the inventive concept. FIG. 14 is a block diagram illustrating a memory device according to an exemplary embodiment of the inventive concept.

For example, a mode register in a mode register set MRS 511 in FIG. 14 may have a setting configuration MRSET as illustrated in FIG. 13. The operand values OP0~OP7 may include refresh rate information, hammer flag information HFG, post-package repair entry/exit information PPRE, thermal offset information, and a temperature update flag TUF.

The memory device may determine whether to start or finish the hammer mode based on the hammer flag information HFG stored in the mode register set 511. The memory device may refer to the hammer flag information HFG to start the hammer mode when the hammer flag information HFG has the first value (e.g., the logic high level H) and finish the hammer mode when the hammer flag information HFG has the second value (e.g., the logic low level L).

Referring to FIG. 14, a memory device 500 may include a command decoder COM DEC 510, an address buffer ADD BUF 520, a memory cell array 530, a row selection circuit RSEL 540, a column selection circuit CSEL 550, an input-output circuit 560, and a refresh controller RFCON 401. The command decoder 510 may include the mode register set MRS 511 to store values for controlling the memory device 500. The input-output circuit 560 may include a write driver WDRV and a read sensing circuit RSEN.

The memory device 500 may include an interface for communicating with a memory controller. For example, the memory device 500 may include a DRAM interface. The DRAM interface may include control pads (or pins), address pads, and data pads. The memory device 500 may receive the command CMD, e.g., control signals including a chip selection signal /CS, a row address strobe signal /RAS, a column address strobe signal /CAS, a write enable signal /WE, a clock enable signal CKE, etc. through the control pads. The memory device 500 may receive the address signal ADD through the address pads, and receive the write data or transmit the read data through the data pads.

The memory cell array 530 may include a plurality of memory cells coupled to a plurality of wordlines WL0 through WLn and a plurality of bitlines BL0 through BLm. The plurality of memory cells may have a configuration that needs a refresh such as a DRAM cell.

The command decoder 510 may generate internal command signals such as an active signal IACT, a precharge signal IPRE, a refresh signal IREF, a read signal IRD, a write signal IWR, etc. based on the control signals /CS, /RAS, /CAS, /WE, and CKE from the memory controller.

The refresh controller 401 may receive the internal active signal IACT, the internal refresh signal IREF, and the above-described hammer address HADD that is provided from the memory controller, and may provide the counter refresh signal CREF, the hammer refresh signal HREF, the counter refresh address signal CRFADD, and the hammer refresh address signal HRFADD for the refresh operation.

The address buffer 520 may generate a row address signal XADD and a column address signal YADD based on an external address ADD transferred from the memory controller. The row address signal XADD may be provided to the row selection circuit 540 and the column address signal YADD may be provided to the column selection circuit 550. Additionally, the memory cell array 530 may include a plurality of memory banks and the address buffer 520 may further provide a bank address signal.

The row selection circuit 540 may select a wordline corresponding to the row address signal XADD among the wordlines WL0 through WLn for the read operation or the write operation. Additionally, the row selection circuit 540 may select a wordline corresponding to the counter refresh address signal CRFADD or the hammer refresh address signal HRFADD among the wordlines WL0 through WLn for the refresh operation. The row selection circuit 540 may select a wordline corresponding to the counter refresh address signal CRFADD when the counter refresh signal CREF is activated, and the row selection circuit 540 may select a wordline corresponding to the hammer refresh address signal HRFADD when the hammer refresh signal HREF is activated. The column selection circuit 550 may select a bitline corresponding to the column address signal YADD among the bitlines BL0 through BLm.

The write driver WDRV and the read sensing circuit RSEN are coupled to the bitlines BL0 through BLm. The write driver WDRV and the read sensing circuit RSEN may be coupled to the bitlines BL0 through BLm directly or via the column selection circuit 550.

FIGS. 15A, 15B, and 15C are timing diagrams illustrating operations of a refresh controller included in the memory device of FIG. 14 according to exemplary embodiments of the inventive concept.

FIGS. 15A, 15B, and 15C illustrate generation of the counter refresh signal CREF, the hammer refresh signal HREF, the counter refresh address signal CRFADD, and the hammer refresh address signal HRFADD, with respect to a refresh signal IREF that is activated with a pulse shape. The intervals between activation time points t1~t9 of the refresh signal IREF may be regular or irregular.

Referring to FIGS. 2, 5, and 15A, the timing controller 410 may activate the counter refresh signal CREF in synchronization with time points t1~t4, t6~t10, t12~t16, and t18~t19 among the activation time points t1~t19 of the refresh signal IREF, and may activate the hammer refresh signal HREF in synchronization with the time points t5, t11, and t17. Even though FIG. 15A illustrates that the counter refresh signal CREF is activated five times for each activation of the hammer refresh signal HREF, the activation ratio of the counter refresh signal CREF and the hammer refresh signal HREF may be changed.

The refresh counter 420 may generate the counter refresh address signal CRFADD representing the sequentially changing addresses X+1~X+15 in synchronization with the activation time points t1~t4, t6~t10, t12~t16, and t18~t19 of the counter refresh signal CREF. The address generator 430 may generate the hammer refresh address signal HRFADD representing the address Ha, Hb, and Hc of the rows that are physically adjacent to the row of the hammer address HADD in synchronization with the activation time points t5, t11, and t17 of the hammer refresh signal HREF. As described with reference to FIG. 5 and illustrated in FIG. 15A, the mapper 450 in the address generator 430 may provide an address corresponding to one of the two adjacent rows. For example, the address Ha may be smaller than the hammer address HADD by 1 at the time point t5, and the address Hb may be larger than the hammer address HADD by 1 at the time point tn. As such, the mapper 450 may alternatively provide the smaller address or the larger address with respect to the hammer address signal at each activation time point of the hammer refresh signal HREF.

Referring to FIGS. 2, 5, and 15B, the timing controller 410 may activate the counter refresh signal CREF in synchronization with the activation time points t1~t19 of the refresh signal IREF, and activate the hammer refresh signal HREF in synchronization with the time points ta, tb, and tc while the refresh signal IREF is deactivated. Even though FIG. 19B illustrates that the counter refresh signal CREF is activated six times for each activation of the hammer refresh signal HREF, the activation ratio of the counter refresh signal CREF and the hammer refresh signal HREF may be changed.

The refresh counter 420 may generate the counter refresh address signal CRFADD representing the sequentially changing addresses X+1~X+18 in synchronization with the activation time points t1~t19 of the counter refresh signal CREF. The address generator 430 may generate the hammer refresh address signal HRFADD representing the address Ha, Hb, and Hc of the rows that are physically adjacent to the row of the hammer address HADD in synchronization with the activation time points ta, tb, and tc of the hammer refresh signal HREF. As described with reference to FIG. 5 and illustrated in FIG. 15B, the mapper 450 in the address generator 430 may provide an address corresponding to one of the two adjacent rows. For example, the address Ha may be smaller than the hammer address HADD by 1 at time point ta, and the address Hb may be larger than the hammer address HADD by 1 at time point tb. As such, the mapper 450 may alternatively provide the smaller address or the larger address with respect to the hammer address signal HADD at each activation time point of the hammer refresh signal HREF.

Referring to FIGS. 2, 5, and 15C, the timing controller 410 may activate the counter refresh signal CREF in synchronization with the time points t1~t4, t7~t10, t13~t16, and t19 among the activation time points t1~t19 of the refresh signal IREF, and activate the hammer refresh signal HREF in synchronization with the time points t5, t6, t11, t12, t17, and t18. Even though FIG. 15C illustrates that the counter refresh signal CREF is activated four times for every two activations of the hammer refresh signal HREF, the activation ratio of the counter refresh signal CREF and the hammer refresh signal HREF may be changed.

The refresh counter 420 may generate the counter refresh address signal CRFADD representing the sequentially changing addresses X+1~X+12 in synchronization with the activation time points t1~t4, t7~t10, t13~t16, and t19 of the counter refresh signal CREF. The address generator 430 may generate the hammer refresh address signal HRFADD representing the address Ha1, Ha2, Hb1, Hb2, Hc1, and Hc2 of the rows that are physically adjacent to the row of the hammer address HADD in synchronization with the activation time points t5, t6, t11, t12, t17, and t18 of the hammer refresh signal HREF. As described with reference to FIG. 5 and illustrated in FIG. 15C, the mapper 450 in the address generator 430 may sequentially provide the addresses corresponding to the two adjacent rows. For example, the address Ha1 may be smaller than the hammer address HADD by 1 at time point t5, and the address Ha2 may be larger than the hammer address HADD by 1 at time point t6. As such, the mapper 450 may alternatively provide the smaller address or the larger address with respect to the hammer address signal at each activation time point of the hammer refresh signal HREF.

Figure 16:
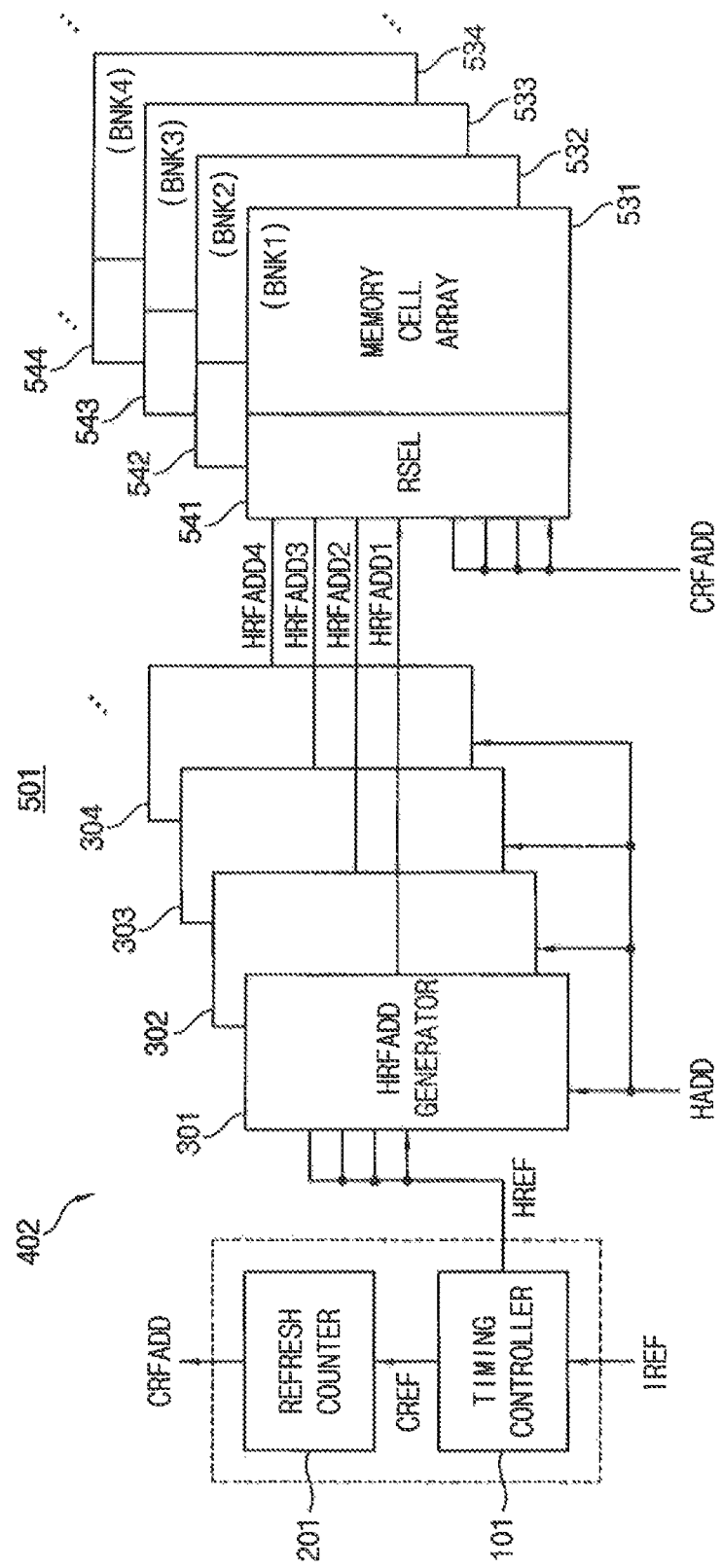
FIG. 16 is a block diagram illustrating a memory device according to an exemplary embodiment of the inventive concept.

FIG. 16 is a block diagram illustrating a memory device according to an exemplary embodiment of the inventive concept. FIG. 16 illustrates an example of a memory device having a multi-bank structure. In FIG. 16, components unrelated to descriptions of the present exemplary embodiment are omitted.

Referring to FIG. 16, a memory device 501 may have a multi-bank structure where a memory cell array therein includes a plurality of memory banks 531, 532, 533, and 534. The plurality of memory banks 531, 532, 533, and 534 may be connected to a plurality of read selection circuits RSEL 541, 542, 543, and 544, respectively. A refresh controller 402 according to an exemplary embodiment of the inventive concept may include a timing controller 101, a refresh counter 201, and an address generator. The address generator may include a plurality of sub-generators 301, 302, 303, and 304.

The timing controller 101 may generate the counter refresh signal CREF and the hammer refresh signal HREF, which are activated selectively, based on the refresh signal IREF provided from a memory controller. The refresh counter 201 may generate the counter refresh address signal CRFADD in response to the counter refresh signal CREF such that the counter refresh address signal CRFADD represents a sequentially changing address. The sub-generators 301, 302, 303, and 304 may correspond to the memory banks 531, 532, 533, and 534, respectively, and generate the hammer refresh address signals HRFADD1, HRFADD2, HRFADD3, and HRFADD4 independently based on the hammer address HADD provided from the memory controller. The hammer refresh address signals HRFADD1, HRFADD2, HRFADD3, and HRFADD4 and the counter refresh address signal CRFADD may be provided to the the memory banks 531, 532, 533, and 534 via the of read selection circuits 541, 542, 543, and 544. The counter refresh signal CREF, the hammer refresh signal HREF, and the counter refresh address signal CRFADD may be provided commonly to the memory banks 531, 532, 533, and 534.

Figure 17A:
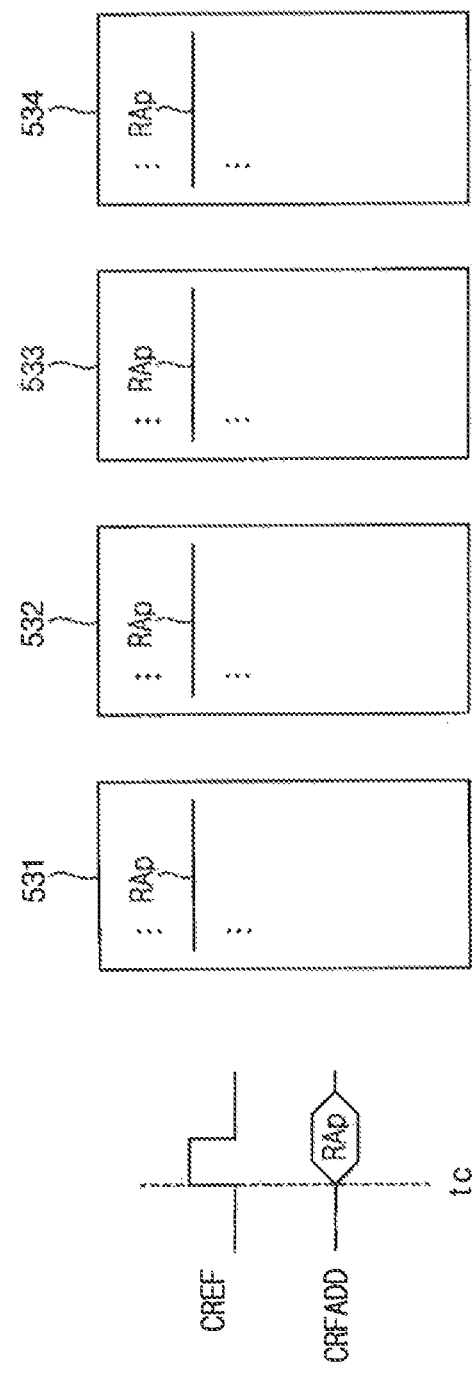
FIGS. 17A and 17B are diagrams for describing an operation of the memory device of FIG. 16 according to an exemplary embodiment of the inventive concept.
Figure 17B:
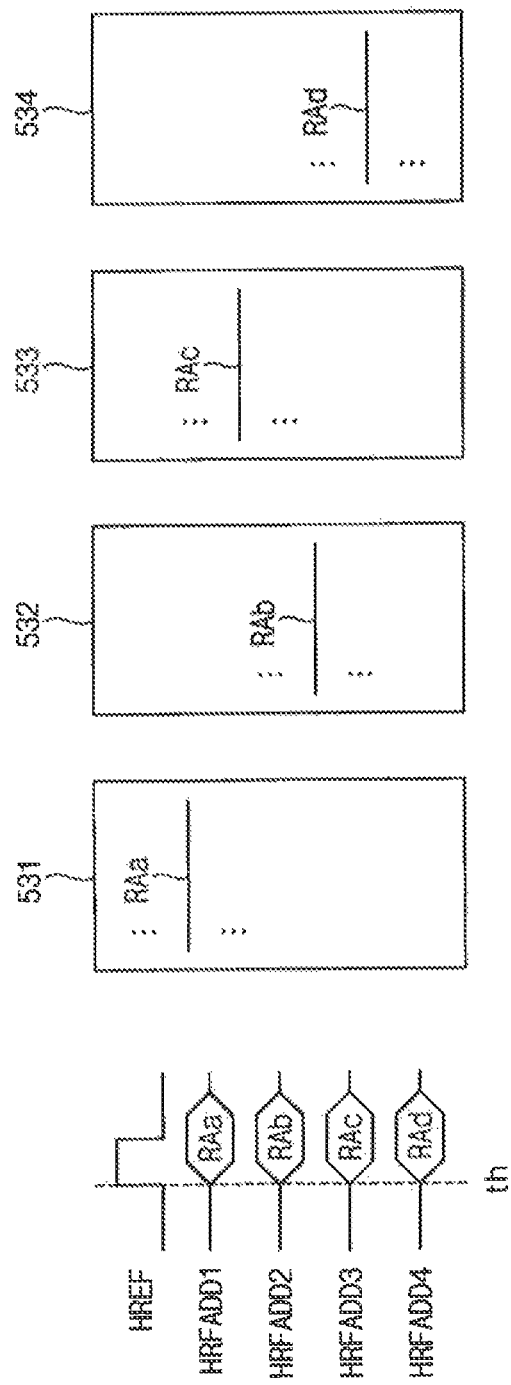

FIGS. 17A and 17B are diagrams for describing an operation of the memory device of FIG. 16 according to exemplary embodiments of the inventive concept.

Referring to FIG. 17A, the counter refresh address signal CRFADD representing a refresh address RAp may be provided commonly to the memory banks 531, 532, 533, and 534 at an activation time point tc of the counter refresh signal CREF. In other words, the memory cells included in rows having addresses corresponding to the counter refresh address signal CRFADD may be refreshed simultaneously in all of the memory banks 531, 532, 533, and 534. According to exemplary embodiments of the inventive concept, the rows in the memory banks 531, 532, 533, and 534 that are refreshed simultaneously in response to the counter refresh signal CREF may have the same row address, as illustrated in FIG. 17A.

Referring to FIG. 17B, the hammer refresh address signals HRFADD1, HRFADD2, HRFADD3, and HRFADD4 representing the refresh addresses RAa, RAb, Rac, and Rad, respectively, may be provided to the memory banks 531, 532, 533, and 534, respectively, at an activation time point th of the hammer refresh signal HREF. In other words, the memory cells included in rows having different refresh addresses RAa, RAb, Rac, and RAd in the respective memory banks 531, 532, 533, and 534 corresponding to the respective hammer refresh address signals HRFADD1, HRFADD2, HRFADD3, and HRFADD4 may be refreshed simultaneously.

Figure 18:
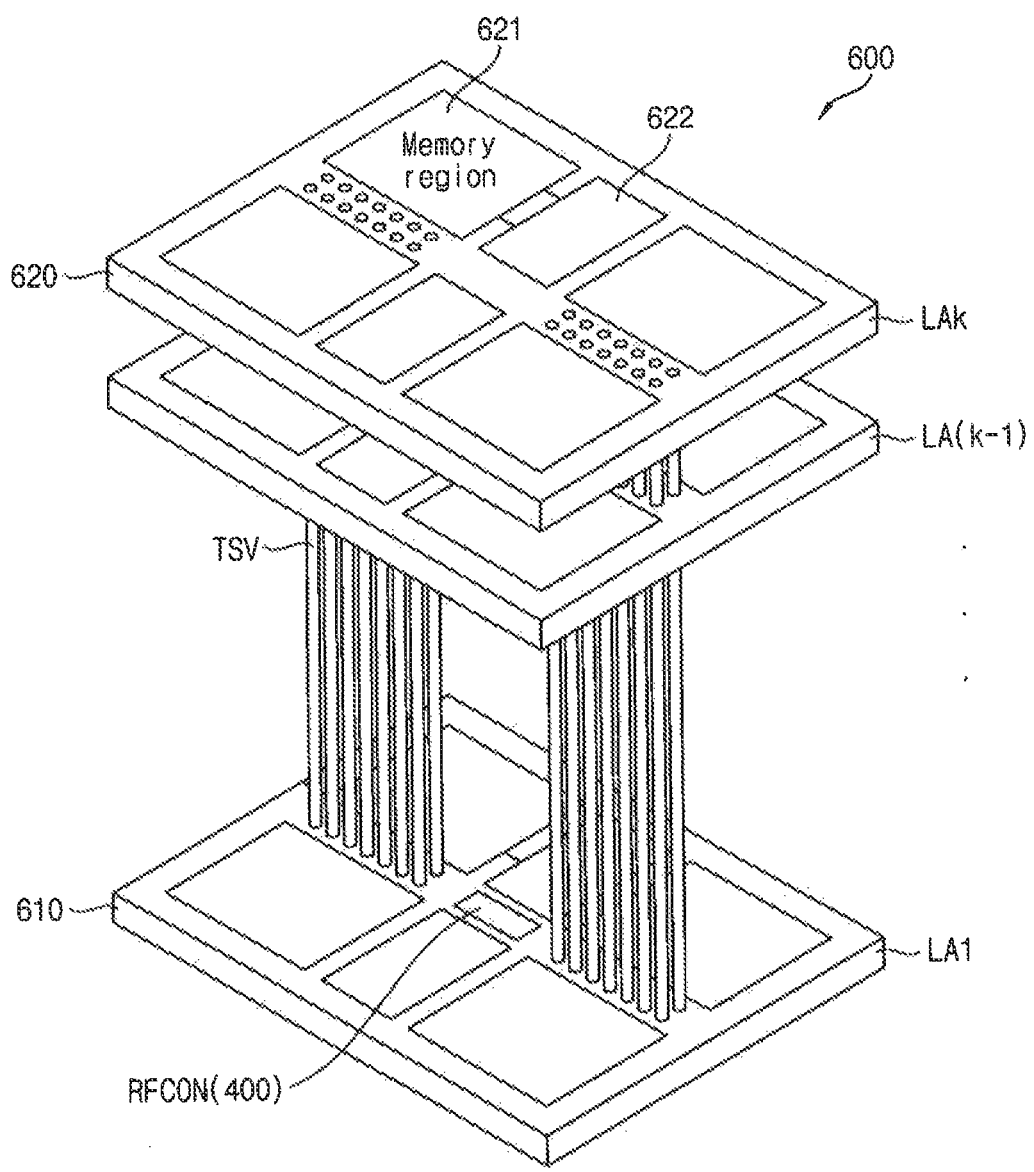
FIG. 18 is a diagram illustrating a structure of a stacked memory device according to an exemplary embodiment of the inventive concept.

FIG. 18 is a diagram illustrating a structure of a stacked memory device according to an exemplary embodiment of the inventive concept.

Referring to FIG. 18, a semiconductor memory device 600 may include first through kth semiconductor integrated circuit layers LA1 through LAk, in which the first semiconductor integrated circuit layer LA1 may be a master layer and the other semiconductor integrated circuit layers LA2 through LAk may be slave layers.

The first through kth semiconductor integrated circuit layers LA1 through LAk may transmit and receive signals between the layers by through-substrate vias (e.g., through-silicon vias) TSVs. The first semiconductor integrated circuit layer LA1 as the master layer may communicate with an external device (e.g., a memory controller) through a conductive structure formed on an external surface of the semiconductor memory device 600.

Structures and operations of the semiconductor memory device 600 may be described mainly with reference to the first semiconductor integrated circuit layer LA1 or 610 as the master layer and the kth semiconductor integrated circuit layer LAk or 620 as the slave layer.

The first semiconductor integrated circuit layer 610 and the kth semiconductor integrated circuit layer 620 may include memory regions 621 and various peripheral circuits 622 for driving the memory regions 621. For example, the peripheral circuits 622 may include a row (X)-driver for driving wordlines of the memory regions 621, a column (Y)-driver for driving bitlines of the memory regions 621, a data input/output unit (Din/Dout) for controlling input/output of data, a command buffer for receiving the command CMD from outside and buffering the command CMD, and an address buffer for receiving the address ADDR from outside and buffering the address ADDR.

The first semiconductor integrated circuit layer 610 may further include a control circuit and the control circuit may generate control signals to control the memory regions 621 based on the command-address signals from the memory controller.

The first semiconductor integrated circuit layer 610 may also include the refresh controller RFCON 400 embedded therein, according to an exemplary embodiment of the inventive concept. As described above, the refresh controller 400 may receive the hammer address HADD provided from the memory controller and perform the hammer refresh operation based on the hammer address HADD.

Figure 19:
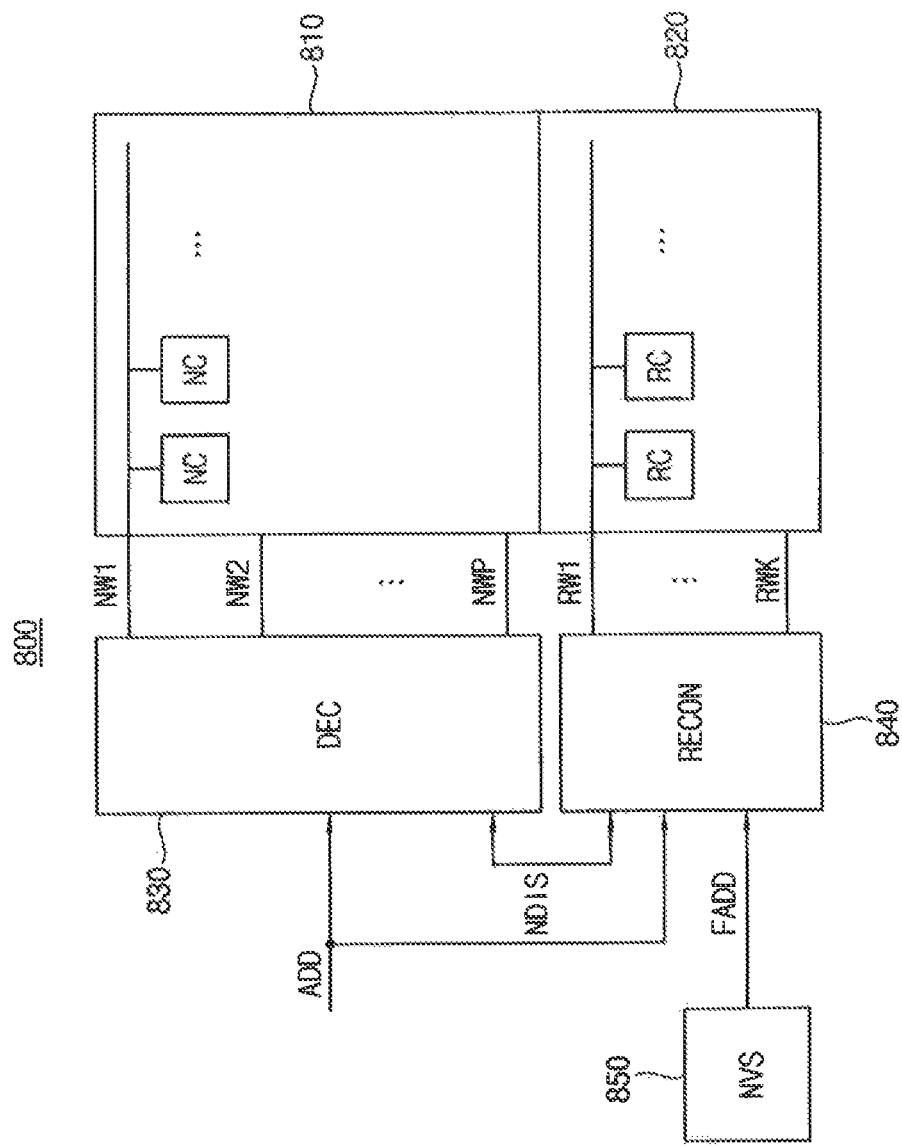
FIG. 19 is a block diagram illustrating a memory device according to an exemplary embodiment of the inventive concept.

FIG. 19 is a block diagram illustrating a memory device according to an exemplary embodiment of the inventive concept.

Referring to FIG. 19, a semiconductor memory device 800 may include a memory cell array 810 and 820, a decoder (DEC) 830, a repair control circuit RECON 840, and a non-volatile storage (NVS) 850. In FIG. 19, components unrelated to descriptions of the present exemplary embodiment are omitted.

The memory cell array 810 and 820 may include a normal memory cell array 810 and a redundancy memory cell array 820. The normal memory cell array 810 includes a plurality of normal memory cells NCs coupled to normal wordlines NW1 through NWP, and the redundancy memory cell array 820 includes a plurality of redundancy memory cells RCs coupled to redundancy wordlines RW1 through RWK.

The decoder 830 selects one of the normal wordlines NW1 through NWP based on the address ADD for the read operation or the write operation. By selecting a normal wordline, the read operation or the write operation may be performed with respect to the normal memory cells NC coupled to the selected one of the normal wordlines NW1 through NWP.

The non-volatile storage 850 stores fail addresses FADD indicating locations of failed memory cells among the normal memory cells NCs, and outputs the stored fail addresses FADD when semiconductor memory device 800 is powered-up. The fail addresses FADD may be obtained and stored in the non-volatile storage 850 through test processes of the semiconductor memory device 800. The fail addresses FADD may be loaded to the repair control circuit 840 during the power-up process.

The repair control circuit 840 controls a repair operation for replacing an access to the normal memory cells NCs with an access to the redundancy memory cells RCs when the address ADD is identical to one of the fail addresses FADD. The repair control circuit 840 may select one of the redundancy wordlines RW1 through RWK and disable the decoder 830 by activating a disable signal NDIS, when the address ADD is identical to one of the fail addresses FADD.

Figure 20:
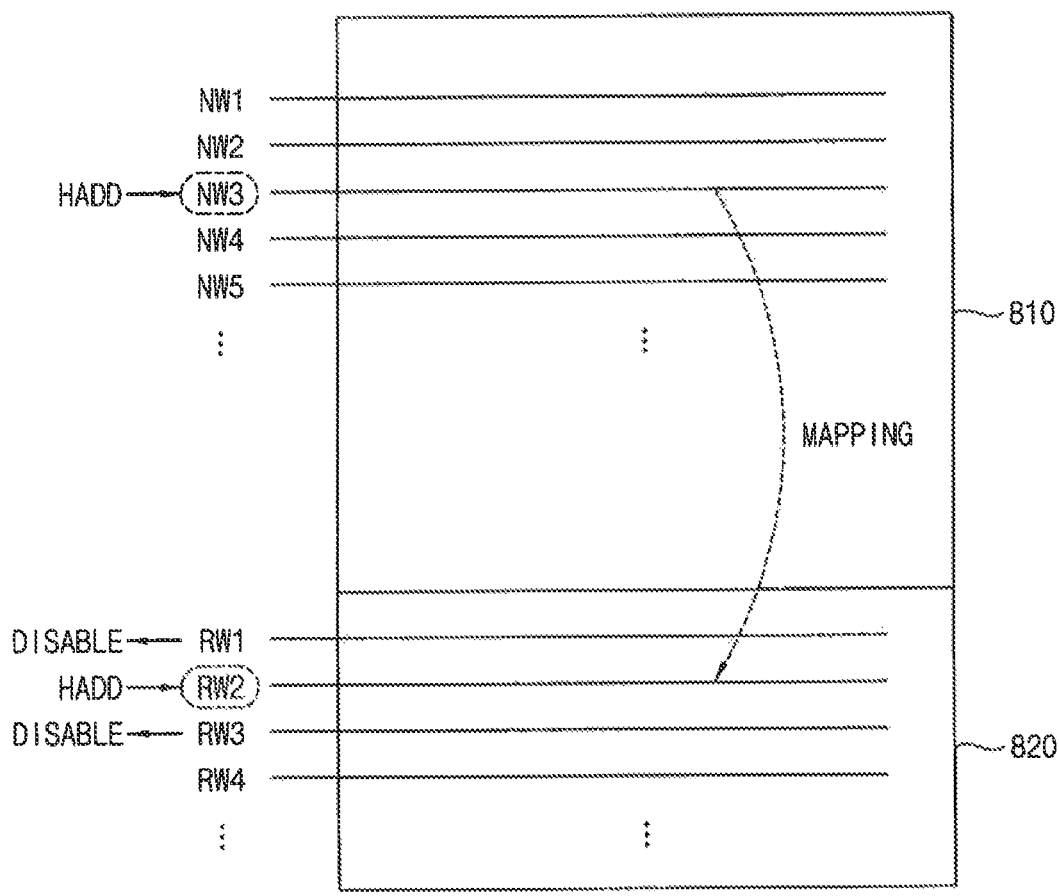
FIG. 20 is a diagram for describing a method of managing a hammer address according to an exemplary embodiment of the inventive concept.

FIG. 20 is a diagram for describing a method of managing a hammer address according to an exemplary embodiment of the inventive concept.

Referring to FIGS. 19 and 20, the semiconductor memory device 800 may map a normal wordline (e.g., NW3) corresponding to the hammer address HADD to a first redundancy wordline (e.g., RW2) and disable second redundancy wordlines RW1 and RW3 adjacent to the first redundancy wordline RW2 such that the second redundancy wordlines RW1 and RW3 are not mapped to an access address. In this case, the normal wordline NW3 corresponding to the hammer address HADD is not actually accessed, and thus, the adjacent normal wordlines NW2 and NW4 do not require the hammer refresh operation.

The semiconductor memory device 800 may disable the second redundancy wordlines RW1 and RW3 adjacent to the mapped first redundancy wordline RW2 so that the adjacent second redundancy wordlines RW1 and RW3 may not be accessed. In other words, a normal wordline corresponding to a fail address may be mapped to the adjacent second redundancy wordlines RW1 and RW3.

Figure 21:
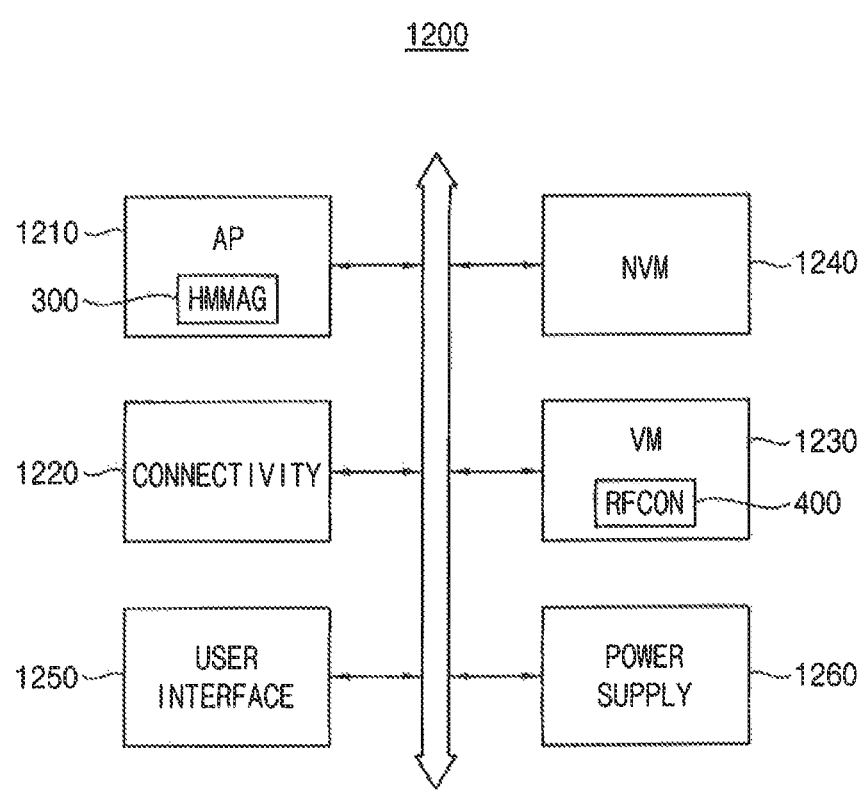
FIG. 21 is a block diagram illustrating a mobile system according to an exemplary embodiment of the inventive concept.

FIG. 21 is a block diagram illustrating a mobile system according to an exemplary embodiment of the inventive concept.

Referring to FIG. 21, a mobile system 1200 includes an application processor (AP) 1210, a connectivity unit 1220, a volatile memory device (VM) 1230, a nonvolatile memory device (NVM) 1240, a user interface 1250, and a power supply 1260. According to exemplary embodiments of the inventive concept, the mobile system 1200 may be, for example, a mobile phone, a smart phone, a personal digital assistant (PDA), a portable multimedia player (PMP), a digital camera, a music player, a portable game console, a navigation system, or another type of electronic device.

The application processor 1210 may execute applications such as a web browser, a game application, a video player, etc. The connectivity unit 1220 may perform wired or wireless communication with an external device. The volatile memory device 1230 may store data processed by the application processor 1210 or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

As described above, the application processor 1210 may include the hammer address manager HMMAG 300 configured to provide the hammer address HADD and the volatile memory device 1230 may include the refresh controller RFCON 400 configured to perform the hammer refresh operation based on the hammer address HADD provided from the application processor 1210. The hammer address detection and the refresh execution may be performed in the application processor 1210 and the volatile memory device 1230, respectively, to distribute the burden of the hammer refresh operation, thus reducing a size of the volatile memory device 1230 and enhancing overall performance of the mobile system 1200.

The inventive concept may be applied to any devices and systems including a memory device requiring a refresh operation. For example, the inventive concept may be applied to systems such as a mobile phone, a smart phone, a PDA, a PMP, a digital camera, a camcorder, personal computer (PC), a server computer, a workstation, a laptop computer, a digital TV, a set-top box, a portable game console, a navigation system, etc.

As described above, according to exemplary embodiments of the inventive concept, the memory device, the memory system, and the associated method may perform the hammer address detection and the refresh execution in the memory controller and the memory device, respectively, to distribute the burden of the hammer refresh operation, thus reducing the size of the memory device and enhancing overall performance of the memory system.

While the inventive concept has been shown and described with reference to exemplary embodiments thereof, it will be understood by those of ordinary skill in the art that various modifications in form and details may be made thereto without materially departing from the sprit and scope of the inventive concept as set forth in the following claims.

What is claimed is:

1. A memory system comprising:
 a memory controller configured to determine and provide a hammer address, wherein the hammer address is an address that has an activation number or frequency greater than a predetermined threshold; and
 a memory device configured to generate a hammer refresh signal representing a timing for a hammer refresh operation to refresh a first row of the memory device that is physically adjacent to a second row of the memory device corresponding to the hammer address, and configured to perform the hammer refresh operation using the hammer address provided from the memory controller and the hammer refresh signal generated by the memory device.

2. The memory system of claim 1, wherein the memory controller provides the hammer address in real time using an active command for an access operation of the memory device.

3. The memory system of claim 2, wherein the memory controller transfers a read command or a write command to the memory device after the memory controller transfers the active command including the hammer address.

4. The memory system of claim 2, wherein the active command includes hammer flag information indicating whether an access address accompanied by the active command corresponds to the hammer address or not.

5. The memory system of claim 4, wherein the memory device determines whether to store the access address as the hammer address using the hammer flag information.

6. The memory system of claim 4, wherein, when the hammer flag information has a first value, the memory device performs the access operation using the access address and stores the access address as the hammer address.

7. The memory system of claim 6, wherein, when the hammer flag information has a second value, the memory device performs the access operation using the access address and does not store the access address as the hammer address.

8. The memory system of claim 1, wherein the memory controller provides the hammer address in real time using a hammer address write command irrelevant to an access operation of the memory device.

9. The memory system of claim 8, wherein the memory device stores an address accompanied by the hammer address write command as the hammer address.

10. The memory system of claim 1, wherein the memory controller sets an operation mode of the memory device to a hammer mode and provides the hammer address during the hammer mode.

11. The memory system of claim 10, wherein the memory device includes a mode register configured to store values for controlling the memory device, and
 wherein the memory controller writes hammer flag information in the mode register using a mode register write command to start or finish the hammer mode.

12. The memory system of claim 10, wherein the memory controller provides the hammer address to the memory device during the hammer mode using an active command for an access operation of the memory device.

13. The memory system of claim 12, wherein, during the hammer mode, the memory controller does not transfer a read command or a write command to the memory device after the memory controller transfers the active command including the hammer address.

14. The memory system of claim 12, wherein, during the hammer mode, the memory device stores an address accompanied by the active command as the hammer address.

15. The memory system of claim 1, wherein the memory controller includes:
 a hammer address manager configured to, using an address signal provided to the memory device, store a plurality of row addresses and access count values representing respective access numbers of the plurality of row addresses, and configured to determine and provide the hammer address among the plurality of row addresses using the access count values.

16. The memory system of claim 1, wherein the memory device includes:
 a hammer address storage configured to store the hammer address provided from the memory controller;
 a timing controller configured to generate the hammer refresh signal using operational characteristics of the memory device; and
 a mapper configured to generate a hammer refresh address signal indicating an address of the first row of the memory device that is physically adjacent to the second row of the memory device corresponding to the hammer address.

17. The memory system of claim 1, wherein the memory device includes a memory cell array including normal memory cells connected to a plurality of normal wordlines and redundancy memory cells connected to a plurality of redundancy wordlines, and
 wherein the memory device maps a first normal wordline, among the plurality of normal wordlines and corresponding to the hammer address, to a first redundancy wordline among the plurality of redundancy wordlines, and disables a second redundancy wordline, among the plurality of redundancy wordlines and adjacent to the first redundancy wordline, such that the second redundancy wordline is not mapped to an access address.

18. The memory system of claim 1, wherein the memory device includes a plurality of memory banks, and
wherein the memory controller determines and provides the hammer address with respect to each of the plurality of memory banks.

19. A memory device comprising:
a hammer address storage configured to store a hammer address provided from a memory controller, wherein the hammer address is an address that has an activation number or frequency greater than a predetermined threshold; and
a timing controller configured to generate a hammer refresh signal using operational characteristics of the memory device, wherein the hammer refresh signal represents a timing for a hammer refresh operation to refresh a row of the memory device that is physically adjacent to a row of the memory device corresponding to the hammer address,
wherein the memory device performs the hammer refresh operation using the hammer address provided from the memory controller and the hammer refresh signal generated by the memory device,
wherein the memory device includes a memory cell array including normal memory cells connected to a plurality of normal wordlines and redundancy memory cells connected to a plurality of redundancy wordlines, and
wherein the memory device maps a first normal wordline, among the plurality of normal wordlines and corresponding to the hammer address, to a first redundancy wordline among the plurality of redundancy wordlines, and disables a second redundancy wordline, among the plurality of redundancy wordlines and adjacent to the first redundancy wordline, such that the second redundancy wordline is not mapped to an access address.

20. A method of operating a memory device, comprising:
generating, by a memory controller, a hammer address, wherein the hammer address is an address that has an activation number or frequency greater than a predetermined threshold;
providing the hammer address from the memory controller to a memory device;
generating, by the memory device, a hammer refresh signal representing a timing for a hammer refresh operation to refresh a row of the memory device that is physically adjacent to a row of the memory device corresponding to the hammer address; and
performing, by the memory device, the hammer refresh operation using the hammer address provided from the memory controller and the hammer refresh signal generated by the memory device,
wherein the memory controller provides the hammer address using an active command for an access operation of the memory device,
wherein the active command includes hammer flag information and an access address, and
wherein the hammer flag information includes a first bit indicating whether the access address is relevant to the hammer address and a second bit indicating whether the access address is to be included or excluded from the hammer address.

* * * * *